A III-nitride semiconductor based heterojunction power device including: a first heterojunction transistor formed on a substrate, and a second heterojunction transistor formed on the substrate. One of the first heterojunction transistor and the second heterojunction transistor is an enhancement mode field effect transistor and the other one of the first heterojunction transistor and the second heterojunction transistor is a depletion mode field effect transistor. The enhancement mode transistor acts as a main power switch, and the depletion mode transistor acts as a start-up component.

(12) United States Patent
Udrea et al.

(10) Patent No.: US 11,658,236 B2
(45) Date of Patent: May 23, 2023

(54) III-V SEMICONDUCTOR DEVICE WITH INTEGRATED POWER TRANSISTOR AND START-UP CIRCUIT

(71) Applicant: Cambridge GaN Devices Limited, Cambourne (GB)

(72) Inventors: Florin Udrea, Cambridge (GB); Loizos Efthymiou, Cambridge (GB); Giorgia Longobardi, Cambridge (GB); Martin Arnold, Cambridge (GB)

(73) Assignee: CAMBRIDGE GAN DEVICES LIMITED, Cambourne (GB)

( * ) Notice: Subject to any disclaimer, the term of this patent is extended or adjusted under 35 U.S.C. 154(b) by 0 days.

(21) Appl. No.: 16/405,537

(22) Filed: May 7, 2019

(65) Prior Publication Data
US 2020/0357909 A1    Nov. 12, 2020

(51) Int. Cl.
*H01L 29/778*    (2006.01)
*H01L 27/095*    (2006.01)
(Continued)

(52) U.S. Cl.
CPC ........ *H01L 29/7787* (2013.01); *H01L 27/027* (2013.01); *H01L 27/0605* (2013.01);
(Continued)

(58) Field of Classification Search
CPC . H01L 27/095; H01L 29/2003; H01L 29/205; H01L 29/66462; H01L 29/7787; H01L 21/8252; H01L 27/0605; H01L 27/085; H01L 27/0883; H01L 29/1066; H01L 29/778

See application file for complete search history.

(56) References Cited

U.S. PATENT DOCUMENTS 10,243,451 B1    3/2019 Knoedgen et al.
2006/0043501 A1*    3/2006 Saito .................. H01L 29/7786
257/401

(Continued)

FOREIGN PATENT DOCUMENTS

EP    3331026 A2    6/2018
WO    2019012293 A1    1/2019

OTHER PUBLICATIONS

Injun Hwang et al., "1.6kV, 2.9 mΩ cm2 Normally-off p-GaN HEMT Device", Proceedings of the 2012 24th International Symposium on Power Semiconductor Devices and ICs 3-7, Jun. 2012—Bruges, Belgium, 4 pages.

(Continued)

*Primary Examiner* — Meiya Li
(74) *Attorney, Agent, or Firm* — Tucker Ellis LLP

(57) ABSTRACT

18 Claims, 11 Drawing Sheets

(51) Int. Cl.
*H01L 29/20* (2006.01)
*H01L 29/205* (2006.01)
*H01L 29/66* (2006.01)
*H01L 27/02* (2006.01)
*H01L 27/06* (2006.01)
*H01L 27/07* (2006.01)
*H01L 27/088* (2006.01)

(52) U.S. Cl.
CPC ........ *H01L 27/0738* (2013.01); *H01L 27/088* (2013.01); *H01L 27/095* (2013.01); *H01L 29/2003* (2013.01); *H01L 29/205* (2013.01); *H01L 29/66462* (2013.01); *H01L 29/778* (2013.01)

(56) References Cited

U.S. PATENT DOCUMENTS

| | | | |
|---|---|---|---|
| 2009/0180304 A1* | 7/2009 | Bahramian | H02M 1/08 363/124 |
| 2013/0140578 A1 | 6/2013 | Yu et al. | |
| 2014/0015591 A1 | 1/2014 | Chen | |
| 2014/0042452 A1 | 2/2014 | Pendharkar | |
| 2015/0076563 A1 | 3/2015 | Yu | |
| 2017/0358495 A1 | 12/2017 | Jiang | |
| 2020/0044032 A1* | 2/2020 | Haeberlen | H01L 29/7787 |
| 2020/0328296 A1* | 10/2020 | Hwang | H01L 29/2003 |

OTHER PUBLICATIONS

Man Ho Kwan et al., "CMOS-Compatible GaN-on-Si Field-Effect Transistors for High Voltage Power Applications", pp. 17.6.1-17.6.4, 2014, 4 pages.
Silvia Lenci et al., "Au-Free AlGaN/GaN Power Diode on 8-in Si Substrate With Gated Edge Termination", IEEE Electron Device Letters, vol. 34, No. 8, Aug. 2013, 3 pages.
Umesh K. Mishra et al., "GaN-Based RF Power Devices and Amplifiers", Proceedings of the IEEE, vol. 96, No. 2, Feb. 2008, pp. 287-305, 19 pages.
Tohru Oka et al., "AlGaN/GaN Recessed MIS-Gate HFET With High-Threshold-Voltage Normally-Off Operation for Power Electronics Applications", IEEE Electron Device Letters, vol. 29, No. 7, Jul. 2008, pp. 668-669, 3 pages.
Yasuhiro Uemoto et al., "Gate Injection Transistor (GIT)—A Normally-Off AlGaN/GaN Power Transistor Using Conductivity Modulation", IEEE Transactions on Electron Devices, vol. 54, No. 12, Dec. 2007, pp. 3393-3399, 7 pages.
Michael J. Uren et al., "Buffer Design to Minimize Current Collapse in GaN/AlGaN HFETs", IEEE Transactions on Electron Devices, vol. 59, No. 12, Dec. 2012, pp. 3327-3333, 7 pages.
Wataru Saito et al., "Recessed-Gate Structure Approach Toward Normally Off High-Voltage AlGaN/GaN HEMT for Power Electronics Applications", IEEE Transactions on Electron Devices, vol. 53, No. 2, Feb. 2006, pp. 356-362, 7 pages.
Yong Cai et al., "High-Performance Enhancement-Mode AlGaN/GaN HEMTs Using Fluoride-Based Plasma Treatment", IEEE Electron Device Letters, vol. 26, No. 7, Jul. 2005, pp. 435-437, 3 pages.
Partial International Search Report for corresponding International Application No. PCT/EP2020/062777, dated Jul. 17, 2020, 16 pages.

* cited by examiner

STATE OF THE ART

STATE OF THE ART

STATE OF THE ART

STATE OF THE ART

STATE OF THE ART

III-V SEMICONDUCTOR DEVICE WITH INTEGRATED POWER TRANSISTOR AND START-UP CIRCUIT

FIELD OF THE DISCLOSURE

The present disclosure relates to power semiconductor devices. Particularly, but not exclusively, the disclosure relates to the use of a hetero-structure AlGaN/GaN high electron mobility transistor for an integrated start-up circuit of a switch mode power supply.

BACKGROUND OF THE DISCLOSURE

A power semiconductor device is a semiconductor device that can be used as a switch or rectifier in power electronics. A power semiconductor device is usually used in "commutation mode" (i.e., it is either on or off, or transits between these two states), and therefore has a design optimized for such usage.

Silicon bipolar junction transistors (BJT), Metal-Oxide-Semiconductor field effect transistors (MOSFET) and insulated gate bipolar transistors (IGBT) are common types of power semiconductor switching devices. Their application areas range from switch mode power supplies for consumer electronics, inverter and converters in hybrid and electric cars, motor control, to RF and microwave circuits and telecommunication systems.

A switch mode power supply (SMPS) is an electronic power supply that utilises switching devices such as MOSFETs that continuously turn on and off at high frequency in order to convert electrical power efficiently. Energy storage devices such as capacitors and inductors complete the circuit by supplying power during the non-conduction state of the switching device.

An SMPS transfers power from a direct current (DC) or alternating current (AC) source (often mains power) to DC loads, such as consumer electronics, while converting voltage and current characteristics. A block diagram of mains operated AC/DC SMPS with output voltage regulation can be seen in FIG. 1.

An SMPS often contains a pulse width modulation (PWM) and/or a frequency modulation (FM) control integrated circuit (IC) for output voltage regulation. The controller is responsible for managing the periods that the power switches present in the SMPS are conducting. Such controllers are often implemented in a feedback loop configuration where an output characteristic of the SMPS is measured (e.g. the supply output voltage). This measured signal is used to determine the time in which the power switch is operated in a conduction or blocking mode. The ratio of conduction mode time over the total period of a switching waveform is defined as the duty cycle. As the DC output load dynamically changes, the controller acts as to adjust the duty cycle such that the necessary output voltage required by the system can be maintained.

In FIG. 1 a feedback is provided from the secondary (output) to the controller. This is known as secondary side control and may involve an opto-coupler. In other topologies primary side control can be used, to eliminate the presence of the opto-coupler.

The controller is powered when the de-coupling capacitor, C, is charged and is essential for the SMPS to operate as desired. This is shown in FIGS. 2 and 3. A DC/DC conversion to power the controller is used as the controller operates at a significantly reduced DC bias voltage compared to the rectified input DC rail voltage ($V_{in}$).

FIG. 2 illustrates a known standard flyback converter which utilises a depletion mode device to charge the de-coupling capacitance of the PWM control IC. The depletion mode MOSFET with an adjustable drain current level powers up the IC operating as a current source with the device being in saturation mode. Resistance, R, can be used to adjust the current level, while changes in the input DC rail ($V_{in}$), will not affect the current level. As the de-coupling capacitor, C becomes increasingly charged, raising the voltage bias on the source of the depletion mode transistor, the gate-source voltage becomes increasingly negative. The depletion mode MOSFET switches to the off-state (i.e. its resistance is greatly increased) as the source voltage approaches the device threshold voltage. A simplified version of the circuit shown in FIG. 2, illustrating the operation of the depletion mode transistor is shown in FIG. 3.

Gallium Nitride (GaN) is a wide band gap material with properties that make it a suitable candidate for use in several fields of application (e.g. radio-frequency electronics, opto-electronics, power electronics) which require solid-state devices.

GaN technology allows transistors with high electron mobility and high saturation velocity to be designed. These properties of GaN have made it a good candidate for high-power and high-temperature microwave applications, for example radar and cellular communications systems. As systems expand in subscribers and desired capacity, interest in increasing their operating frequency and power has grown correspondingly. Higher frequency signals can carry more information (bandwidth) and allow for smaller antennas with very high gain.

Additionally, GaN with its wide bandgap offers the potential for emitting light at higher frequencies for example the green, blue, violet, and ultraviolet portions of the electromagnetic spectrum.

Gallium Nitride (GaN) has increasingly been considered as a very promising material for use in the field of power devices with the potential to lead to increased power density, reduced on-resistance, and high frequency response. The application areas range from portable consumer electronics, solar power inverters, electric vehicles, and power supplies. The wide band gap of the material ($E_g$=3.39 eV) results in high critical electric field ($E_c$=3.3 MV/cm) which can lead to the design of devices with a shorter drift region, and therefore lower on-state resistance if compared to a silicon-based device with the same breakdown voltage.

The use of an Aluminium Gallium Nitride (AlGaN)/GaN heterostructure also allows the formation of a two-dimensional electron gas (2DEG) at the hetero-interface where carriers can reach very high carrier mobility ($\mu$=2000 cm$^2$/(Vs)) values. In addition, the piezopolarization charge present at the AlGaN/GaN heterostructure, results in a high electron density in the 2DEG layer (e.g. 1×10$^{13}$ cm$^{-2}$). These properties allow the development of High Electron Mobility Transistors (HEMTs) and Schottky barrier diodes with very competitive performance parameters. An extensive amount of research has focused on the development of power devices using AlGaN/GaN heterostructures.

However, the 2DEG which inherently exists at the AlGaN/GaN hetero-interface creates a challenge when attempting the design of enhancement mode rather than depletion mode devices. Nonetheless, several methods have been proposed which can lead to enhancement mode devices, among them the use of metal insulator semiconductor structures, use of fluorine treatment, recessed gate structures, and use of a p-type GaN layer. Due to the relative maturity and controllability in the epitaxial growth of pGaN layers compared to the other techniques, pGaN/AlGaN/GaN HEMTs are currently the leading structure for commercialization.

FIG. 4 shows schematically a cross section of the active area of a pGaN HEMT, according to the state-of-the-art. The device includes an AlGaN layer 1, a GaN layer 2 (also known as GaN buffer layer), a transition layer 3, a silicon substrate 4, a substrate terminal 5, a SiO$_2$ passivation 6, the surface passivation dielectric 7, a source terminal 8, a drain terminal 9, a gate terminal 10, and a highly p-doped GaN cap 11. The device shown is a lateral three-terminal device with an AlGaN/GaN heterostructure grown epitaxially on a standard silicon wafer. The transition layer 3 is used to allow a high quality GaN layer to be grown despite the significant lattice mismatch between GaN 2 and Si 4. Carbon p-type doping is often added in the GaN layer and in the transition layer. Finally, a thin cap GaN layer is typically added to form the gate with a Magnesium (Mg) p-type doping density greater than $1\times10^{19}$ cm$^{-3}$. A typical pGaN gate device has a threshold voltage of ~1.5-2 V and gate turn-on bias voltage of ~8 V.

While an enhancement mode device is used in some power electronic applications as the main power switch there are applications where a depletion mode device can be more suitable or can be used in addition to an enhancement mode device; for example in start-up circuitry in the power supply applications described above. In general, a depletion mode AlGaN/GaN transistor is made by placing a Schottky metal contact 12, which acts as the gate terminal, directly on the AlGaN layer 1 (excluding the pGaN cap layer which exists in the enhancement mode devices) as seen in FIG. 5.

In state-of-the-art devices it is not straightforward to integrate the start-up component with the main power transistor. This is due to compatibility issues between the Schottky gate used for the normally-on transistors, and the pGaN gate used for the normally-off transistors. In addition, the threshold control of a normally on transistor is limited to the use of the Schottky metallization and furthermore, such control, would be even more limited if a normally-off device using a p-GaN gate was monolithically integrated.

In some state-of-the-art systems, a resistance component is used instead of a depletion mode device. This is a less efficient solution as any changes in the input rail voltage ($V_{in}$) would affect the charging time of the decoupling capacitor, C. To reduce the charging time would either require a reduction in the resistance used (which would increase the charging losses) or a reduction in the size of the capacitance, C which is not often possible.

In state-of-the-art depletion mode Schottky gate devices the threshold voltage of the device (i.e. the gate bias voltage at which the device is considered to move from the on-state to the off-state and vice versa) is dependent on process parameters such as, but not limited to, the AlGaN layer thickness, Aluminium mole fraction and gate metal stack. Therefore, to adjust the threshold voltage to a level which is most suitable for a specific application would require a change in the epitaxial growth and/or the gate metal processing, which is time consuming and expensive. The ability to reliably adjust the device threshold voltage through layout modifications would be significantly less time consuming and more cost efficient in comparison. Such capability does not currently exist in the state-of-the-art.

State-of-the-art depletion mode Schottky gate devices have a limit on the maximum positive gate bias voltage which can be applied on the gate terminal before the main on-state conduction path (i.e. low resistance path) changes from drain-source to gate-source in the on-state. This maximum bias voltage depends on the Schottky barrier height present at the gate contact and does not exceed 2 V. A normally-on HEMT device which can be biased beyond this voltage level does not exist in the state-of-the-art.

US 2014/042452 and US 2014/015591 suggest using a depletion mode HEMT in the gate to limit overvoltage.

US 2015/076563 relates to a conventional normally-on HEMT with pGaN islands on the AlGaN layer placed in the same direction as the current flow, between the source and drain terminal. The p-GaN islands are provided alongside the drift region, in the same direction of the current flow between the source and the drain. In this arrangement, p-GaN islands cannot be used to control the threshold voltage of a device.

SUMMARY

The disclosure relates to the use of a monolithically integrated GaN-based device which preferably contains a normally-off enhancement mode field-effect transistor as the main power switch and a high voltage, normally-on, depletion mode transistor as a start-up component.

It is an object of the present disclosure to provide a monolithically integrated GaN-based device which contains a normally-off, enhancement mode transistor as the main power switch and a normally-on, high voltage depletion mode transistor as a start-up component. The enhancement mode transistor may contain continuous stripes or closed shapes of highly doped semiconductor gate structures placed between the main terminals of the power switch, the source, and the drain. The depletion mode transistor may contain a gate structure based on discontinuous highly doped semiconductor layer containing islands within stripes or closed shapes around the cells that act to modulate the conductive path between the high voltage terminal and low voltage terminal, when a gate voltage is provided. All such islands may be connected to the same gate electrode. The start-up component may be further connected to an internal or external capacitor to provide a supply voltage for other electronic components such as the controller or protection circuits in a switch mode power supply.

The devices of the disclosure are advantageous over state-of-the-art devices for the following reasons:
  The start-up component can be integrated monolithically with the main, enhancement mode, power transistor. This integration allows a reduction in the overall system size/costs as well as lower BOM (bill of material) and increased reliability;
  The integration leads to improved performance through the reduction of parasitic components associated with the interconnections between discrete devices;
  Both the enhancement mode and the depletion mode device can be manufactured within the same fabrication process. The ability to form an enhancement mode and depletion mode device without any additional process steps reduces the cost of the integrated device;
  The use of a depletion mode HEMT, rather than a resistor, with the enhancement mode device is more energy efficient;
  In embodiments where the gate of the depletion mode device includes discrete highly doped regions, the proposed device enables the control of the depletion device threshold voltage through adjustments in the layout design of the transistor rather than adjustments in epitaxial growth or the gate metal stack. Layout re-design can lead to an optimized device at a much lower cost/effort than the other methods used in state-of-the-art devices;

An increased positive gate bias voltage can be applied (>7 V) to the depletion mode device before the main on-state conduction channel changes from drain-source to gate-source. At higher positive gate terminal bias, an increased carrier density in the channel beneath the gate terminals may be achieved, reducing the overall on-state resistance and therefore losses of the device.

In one configuration, where the gate is biased at 0 V and the source is elevated to higher potential, by charging for example a capacitor, the maximum potential level on the source terminal before the depletion mode transistor turns-off could be adjusted by layout design, more precisely by controlling the distance between the pGaN islands. This is advantageous, as this exact potential level may be dependent on the application. Adjustments of this potential level could be done at layout level without the need for process modifications function of different applications.

According to one aspect of the present disclosure there is provided a III-nitride semiconductor based heterojunction power device comprising:

a first heterojunction transistor formed on a substrate, the first heterojunction transistor comprising:
  a first III-nitride semiconductor region formed over the substrate, wherein the first III-nitride semiconductor region comprises a first heterojunction comprising at least one two dimensional carrier gas of second conductivity type;
  a first terminal operatively connected to the first III-nitride semiconductor region;
  a second terminal laterally spaced from the first terminal and operatively connected to the first III-nitride semiconductor region;
  a first plurality of highly doped semiconductor regions of a first conductivity type formed over the first III-nitride semiconductor region, the first plurality of highly doped semiconductor regions being formed between the first terminal and the second terminal;
  a first gate region operatively connected to the first plurality of highly doped semiconductor regions; and
a second heterojunction transistor formed on the substrate, the second heterojunction transistor comprising:
  a second III-nitride semiconductor region formed over the substrate, wherein the second III-nitride semiconductor region comprises a second heterojunction comprising at least one two dimensional carrier gas of second conductivity type;
  a third terminal operatively connected to the second III-nitride semiconductor region;
  a fourth terminal laterally spaced from the third terminal in the first dimension and operatively connected to the second III-nitride semiconductor region;
  a second gate region being formed over the second III-nitride semiconductor region, and between the third terminal and the fourth terminal,
  wherein one of the first and second heterojunction transistors is an enhancement mode field effect transistor and the other of the first and second heterojunction transistors is a depletion mode field effect transistor.

The disclosure provides an integrated device which may use an enhancement mode HEMT as the main power switch and a high voltage depletion mode HEMT which can power the auxiliary electronics integrated in a switch mode power supply. The depletion mode HEMT in the integrated device described can be used as a start-up device to provide a low voltage, such as 5 V, from a high voltage rail.

In the state-of-the-art systems, such as the circuit shown in FIG. 3, the output voltage is given by the gate threshold voltage. The energy efficiency of this DC/DC conversion is poor, and the losses will be high. Therefore, it can only be used for a short time or for small power.

The use of a depletion mode HEMT in the present disclosure, rather than a resistor in its place, is a more energy efficient and elegant solution.

The monolithic integration of the components described above allows a reduction in the overall system size and costs. It also leads to improved performance through the reduction of parasitic components associated with the interconnections between discrete devices.

Preferably, the starting substrate may be silicon. However, any other substrate compatible with state-of-the-art fabrication processes for GaN devices may be used. Employment of a silicon substrate facilitates low cost, high reproducibility, and wide availability of foundries supporting the process. Alternative substrate materials may include sapphire, silicon carbide (SiC), gallium nitride (GaN), and gallium arsenide (GaAs). Other alternatives may also be possible. Also, this disclosure covers the possibility of growing the III-nitride semiconductor region comprising the heterojunction (or heterostructure) on a first substrate suitable for the purpose and then transferring the heterostructure on a second substrate. The second substrate might be any of the previously mentioned substrates or a different one (e.g. a polydimethylsiloxane, PDMS, flexible substrate, diamond). Silicon as substrate material will be used for illustrative purposes in the embodiments hereafter and in the accompanying drawings.

The first gate region may be formed over the first plurality of highly doped semiconductor regions. The first gate region may comprise an Ohmic contact. Alternatively, the active gate region may comprise a Schottky contact. In principle, the Ohmic contact provides higher hole injection, which could be favourable for trap passivation and stability of the device under high voltage stress conditions, whereas the Schottky contact provides lower gate leakage during on-state.

The first and second terminal may be laterally spaced from each other in the first dimension or alternatively the first and second terminal may be spaced from each other in a second dimension.

The first heterojunction of the first III-nitride semiconductor region may comprise: a first III-nitride semiconductor layer having a first band gap formed over the substrate; a second III-nitride semiconductor layer having a second bandgap different from the first band gap disposed on the first III-nitride semiconductor layer; and at least one two-dimensional carrier gas formed at the interface between the first and second III-nitride semiconductor layers to provide a channel. The second heterojunction of the second III-nitride semiconductor region may comprise: a third III-nitride semiconductor layer having a first band gap formed over the substrate; a fourth III-nitride semiconductor layer having a second bandgap different from the first band gap disposed on the third III-nitride semiconductor layer; and at least one two-dimensional carrier gas formed at the interface between the third and fourth III-nitride semiconductor layers to provide a channel.

Each of the first III-nitride semiconductor layer, second III-nitride semiconductor layer, third III-nitride semiconductor layer, and fourth III-nitride semiconductor layer may comprise any one of gallium nitride (GaN), aluminium gallium nitride (AlGaN) and indium aluminium gallium nitride (InAlGaN).

The heterostructures may comprise elemental semiconductors (e.g. Si, Ge), binary compounds from Group III and Group IV (e.g. GaAs), or Group II and Group VI (e.g. ZnS), or Group III and Group V (e.g. GaN), binary alloy semiconductors (e.g. SiGe), ternary alloys (e.g. AlGaAs), quaternary alloys (e.g. InGaAsP) or even pentary materials (e.g. GaInPSbAs). Some examples of possible heterostructures thus follow: AlGaAs/GaAs, InGaP/GaAs, InP/InGaAs, InAlAs/InGaAs, SiGe/Si, AlGaAs/InGaAs, InAlAs/InGaAs and InAlN/GaN, AlGaN/GaN. Preferably the heterostructures will be an AlGaN/GaN heterostructures comprising a two dimensional electron gas (2DEG); this will be used for illustrative purposes in the embodiments hereafter and in the accompanying drawings. GaN and AlGaN technology allows transistors with high electron mobility and high saturation velocity to be designed.

The at least one two dimensional carrier gas may be a two dimensional electron gas (2DEG) or a two dimensional hole gas (2DHG). The 2DEG has the advantage of much higher carrier mobility than the 2DHG.

The first heterojunction transistor may be configured as an enhancement mode field effect transistor, and the second heterojunction transistor may be configured as a depletion mode field effect transistor.

The second gate region may comprise a Schottky contact. Alternatively, the second gate region may comprise an Ohmic contact.

The second heterojunction transistor may further comprise a second plurality of highly doped semiconductor regions formed over the second III-nitride semiconductor region. The second gate region may be formed over the second plurality of highly doped semiconductor regions. The second plurality of highly doped semiconductor regions may comprise at least two highly doped semiconductor regions laterally spaced from each other in a second dimension.

The highly doped semiconductor regions (islands) may be placed on the semiconductor surface of the heterojunction and at zero gate-source terminal bias they create a depletion of the conductive channel (two-dimensional (2D) carrier gas) directly under it, but not in the region between them where the 2D carrier gas remains un-depleted Thus, an uninterrupted channel is present at zero gate-source bias between the third (source) and fourth (drain) terminals along the paths where the highly doped layer is not present (on the 2D carrier gas formed under the region between the islands). This uninterrupted channel is present as long as the gate-source bias is greater than the first threshold voltage.

With a more negative bias applied to the gate terminal with respect to the source terminal (or alternatively more positive source bias applied to the source with respect to the gate), the carrier concentration in the conductive channel (region) between the drain and source terminals is reduced due to electric field extending from the highly doped islands to the region between the islands. This lateral field (with a direction perpendicular to the current flow) depletes the 2D carrier gas formed under the region between highly doped semiconductor islands and thus obstructs the current path through the 2D carrier gas between the source (third terminal) and the drain (fourth terminal). The critical gate bias value at which the device is considered to move from the on-state (low resistance) to the off-state is defined as the first threshold voltage or the device threshold voltage. Note that as mentioned above, instead of applying a negative potential to the gate with respect to the source terminal, it is also possible to keep the gate grounded and applying a positive potential to the source with the same result.

Each of the highly doped semiconductor regions may be spaced from the nearest other highly doped semiconductor region. The threshold voltage may be controlled by the separation between adjacent highly doped islands, layer thicknesses, and doping fractions. The specific on-state resistance of the depletion mode transistor may be controlled by the number of separations between highly doped islands and the width/area of the highly doped islands with respect to the separation distance/separation area between the islands.

The at least two highly doped semiconductor regions may comprise discrete regions, wherein each of the at least two highly doped semiconductor discrete regions may be separated from the nearest other highly doped semiconductor regions by a predetermined distance. The discrete regions (or discontinuous islands) may be formed such that between adjacent islands there is no highly doped semiconductor layer present, and as such, there is a direct, unobstructed conductive path between the third terminal (source) and the fourth terminal (drain) provided by an un-depleted 2D carrier gas layer. Adjacent islands may be placed close together in a line across (and orthogonal to) the current path, such that the potential applied to the gate modulates the conductive region (i.e. the portion of the 2D carrier gas layer) between the islands and thus modulates the direct path between the source and the drain.

There are advantages at the device level of the proposed depletion mode transistor used as a component of the proposed device, compared to a Schottky gate depletion mode AlGaN/GaN HEMT as shown in the state-of-the-art devices such as that shown in FIG. 5.

The proposed device enables the control of the device threshold voltage through adjustments in the layout design of the transistor rather than adjustments in epitaxial growth or the gate metal stack. Layout re-design leads to an optimized device at a much lower cost/effort than other methods currently available.

The depletion mode device used as a component may be a normally-on depletion mode device where an increased positive gate bias voltage can be applied (>7 V) before the main on-state conduction channel changes from drain-source to gate-source. Currently in state-of-the-art devices the voltage at which gate turn-on occurs is typically between 0.7-2 V. At a higher positive gate terminal bias, the disclosed device can achieve an increased carrier density in the channel beneath the gate terminals reducing the overall on-state resistance and therefore losses of the device.

The at least two highly doped semiconductor regions may be aligned in the first dimension. In other words, the at least two highly doped semiconductor regions may form a line of highly doped semiconductor regions extending in the second dimension, in a different direction to the current flow between the first terminal and the second terminal.

The depletion mode transistor may have two threshold voltages. The first threshold voltage may be negative and may be equivalent to that of a classical normally-on transistor, indicating the transition from the off-state to the on-state. Preferably, the second threshold voltage may be positive and may be characterised by a steep current increase. The second threshold voltage can occur at the same value as the threshold voltage of the integrated normally-off device featuring a continuous highly doped semiconductor gate.

When the gate voltage of the depletion mode transistor is very negative, the adjacent highly doped semiconductor gate islands deplete the portion of the 2D carrier gas between them, obstructing the path for electrons or holes to flow from the source to drain. Once the gate-source voltage is equal or greater than the first threshold voltage, the 2D carrier gas starts forming at the middle of the pitch between adjacent p-islands. At this stage a conductive path is established between the source and drain. The value of the first threshold voltage can be adjusted by controlling the pitch between adjacent highly doped semiconductor islands. As the gate-source voltage is increased above the first threshold voltage but remaining below the second threshold voltage, the formation of the 2D carrier gas channel spreads from the middle of the pitch between adjacent highly doped semiconductor islands towards the edges of the highly doped semiconductor gate islands. The current continues to increase as the on-state resistance is reduced. When the second threshold voltage (which is preferably positive) is reached, a steep increase in the current is seen as the 2D carrier gas spreads directly under the highly doped (p gate) islands allowing the current to flow through this region, thus resulting in an increase conduction area. This is characterised by a steep increase in current and, as a result, a steep decrease in the on-state resistance. The rate of the current increase depends on the ratio between the width of the highly doped semiconductor gate islands and the pitch between them.

The at least two highly doped semiconductor regions may be in contact with the second III-nitride semiconductor region. Preferably, the at least two highly doped semiconductor regions may be in contact with the fourth III-nitride semiconductor layer.

The first dimension may be perpendicular to the second dimension. Therefore, the highly doped semiconductor regions, and the spaces between adjacent highly doped semiconductor regions, are formed between the source and the drain terminal.

The at least two highly doped semiconductor regions may comprise a p-type gallium nitride (p-GaN) material. The pGaN forms a barrier with the AlGaN material underneath. The high doping of the pGaN facilitates a depletion region to penetrate the AlGaN layer all the way to the 2DEG, function of the potential applied to the gate terminal with respect to the source terminal. Hole tunnelling occurs from the gate terminal into the semiconductor when the potential on the gate is increased. A certain amount of hole current through the gate has a positive effect on the stability of the device during dynamic high voltage stress, but if the current is too high this is seen as leakage in the control terminal affecting the driver and the total losses of the device.

The device may further comprise a transition layer formed between the substrate and the first III-nitride semiconductor region or the second III-nitride semiconductor region. The transition layer may be present between the heterostructure and the bulk substrate to minimise the lattice mismatch or accommodate the mechanical stress in the heterostructure. The transition layer may comprise a nucleation layer. The nucleation layer may be made of Aluminium Nitride (AlN) or any other suitable material, and may be placed on the substrate. The nucleation layer may form the first sub-layer of a transition layer made of different sub-layers containing the same materials as the first and second semiconductor layers of the heterostructure device (for example AlGaN or GaN materials). This helps to release the mechanical stress and accommodate the lattice mismatch between the substrate (for example silicon) and the heterostructure formed on top.

In embodiments of the disclosure where the substrate is silicon and the heterostructure is based on III-Nitride compounds such as GaN, the transition layer may comprise a single layer of $Al_xGaN_{1-x}N$ (x being the aluminium mole fraction of the compound) or any composition of $Al_xGaN_{1-x}N/Al_yGaN_{1-y}N$ (y being the aluminium mole fraction of the compound) creating a multilayer stack, also known as superlattice.

The first heterojunction transistor and the second heterojunction transistor may be monolithically integrated within a single device, using the same substrate and sharing the AlGaN/GaN layers above the substrate.

Advantageously, the depletion mode transistor could be integrated monolithically with the main, often enhancement mode, power transistor. This integration allows a reduction in the overall system size/costs as well as lower BOM (bill of material) and increased reliability. In addition, it can lead to improved performance through the reduction of parasitic components associated with the interconnections between discrete devices.

The first heterojunction transistor and the second heterojunction transistor may be laterally spaced from each other in the first dimension. The first heterojunction transistor and the second heterojunction transistor may be in physical contact to each other or may be separated by a distance.

The heterojunction power device may further comprise an isolation layer formed between the first heterojunction transistor and the second heterojunction transistor.

The isolation layer could be formed by etching selectively the AlGaN layer all the way to the GaN layer underneath, to remove locally the 2D carrier gas. After etching a passivation layer could be deposited and possibly fill the space created in the recess by etching.

The isolation could be defined in terms of the layout as the part of the device outside the active area (AA mask layer). This signifies the area of the device where a 2D carrier gas layer is not present.

The first heterojunction transistor and the second heterojunction transistor may be formed within the same active area of the device, for example by sharing the drain region and the drain terminal together. Alternatively, the first heterojunction transistor and the second heterojunction transistor may be formed into two distinctive blocks of the active area (i.e. an isolation region is present between them).

The first heterojunction transistor may be configured as a power switch. The first heterojunction transistor may be a normally-off device, as this is preferred, when the device is operated as a switch in power electronics applications. The first heterojunction transistor has to withstand the rated voltage (e.g. 100 V, 200 V or 600 V), meaning the at its breakdown voltage has to be in excessed of the rated voltage and transport in the on-state a nominal current (e.g. 1 A, 20 A, 100 A) function of the power rating and the requirements of the system where the device is employed. The gate terminal is connected to a gate driver, which could be monolithically integrated with the switch or provided externally. The gate control determines if the switch is on or off or transits between these states. When we refer to a normally-off the device, we mean that at 0 V applied between the gate and the source the switch is normally off and only when a positive gate to source voltage is applied, above the threshold voltage the device becomes on. Broadly, in terms of requirements and system operation, the power switch is similar to other power switches such as Power MOSFETs or IGBTs.

The second heterojunction transistor may be configured to operate as a start-up component. As a start-up, the second heterojunction transistor may be a normally-on device (as the first threshold voltage is negative. In a basic example of a start-up scheme, the gate of the second heterojunction transistor may be connected to the ground or the source of the first heterojunction transistor (i.e. power switch). The source of the second heterojunction transistor (i.e. normally-on transistor) could be connected to a capacitor, which could be monolithically integrated or external. The drains of the first and second heterojunction transistors are connected to the same terminal. When the high rail voltage is present on the common drain terminal, the normally on-device is on, charging the capacitor until its source potential is elevated to a potential above the absolute value of the first threshold voltage at which point the second heterojunction transistor which acts as a start-up device, turns-off. This helps to create a low voltage supply for other circuits in the power system (such as controller).

The second heterojunction transistor may be configured to operate as a high electron mobility transistor.

The second heterojunction transistor may be configured to operate a diode. When operated as a diode, preferably, the active gate region may be operatively connected to the third (source) terminal. Alternatively, the active gate region may be operatively connected to the fourth (drain) terminal.

The diode could be used as an anti-parallel diode, conducting current in the opposite direction to the power switch. The diode could be further used as free-wheeling diode. In this case the sources of the tow transistors are connected together, the drains of the two transistors are connected together, the gate of the main switch is the control terminal while the gate of the normally-on transistor is connected to the source of the normally-on transistor to allow a diode operation.

Several such power switches (normally-off transistors) and normally-on transistors configured as anti-parallel diodes could be monolithically integrated. One example is a half bridge configuration where one power switch is operated in the low-side and the other power switch is operated in the high side. Each of these power switches could feature an anti-parallel normally-on transistor configured as diode.

Preferably, the distance between adjacent highly doped semiconductor regions may be less than 1000 nm. More preferably, the distance between adjacent highly doped semiconductor regions may be less than 500 nm.

In both the start-up and the anti-parallel configurations, as mentioned, the second terminal and the fourth terminal may be operatively connected. In other words, the drain terminal of the first heterojunction transistor may be operatively connected to the drain terminal of the second heterojunction transistor. The drain region may be a single drain region wherein both the first heterojunction transistor and the second heterojunction transistor are connected to the single drain region.

The drain region of the first heterojunction transistor and the drain region of the second heterojunction transistor may provide self-isolation between the first heterojunction transistor and the second heterojunction transistor, in embodiments without a separate isolation structure.

In the start-up configuration, the first terminal may be operatively connected to the second gate region. In other words, the source terminal of the first heterojunction transistor may be connected to the gate region of the second heterojunction transistor.

The first heterojunction transistor and the second heterojunction transistor may share the same active area. There may be no distinctive isolation between the first heterojunction transistor and the second heterojunction transistor, other than that provided by the drain terminal as self-isolation. The first III-nitride semiconductor region and the second III-nitride semiconductor region may form a continuous semiconductor region. The first heterojunction transistor and the second heterojunction transistor may be formed on a single substrate. The first III-nitride semiconductor region and the second III-semiconductor region may form a single region for both the first heterojunction transistor and the second heterojunction transistor. In other words, the transistors are monolithically integrated sharing the same substrate, transition layers and GaN buffer layers. This helps to reduce the device manufacturing cost, the packaging cost and the bill of material.

According to a further aspect of the present disclosure, there is provided a circuit comprising the heterojunction power device described above, and further comprising a capacitor electrically connected to third terminal of the normally-on transistor. The normally-on transistor of the when used as a start-up device, may be further connected to an internal or external capacitor to provide a supply voltage for other electronic components, such as the controller or protection circuits in a switch mode power supply.

The source terminal of the depletion mode transistor (the third terminal) may be connected to an internal or external decoupling capacitor such that the capacitor is being charged when the depletion mode (first heterojunction) transistor is in the on-state. As the de-coupling capacitor becomes increasingly charged, raising the voltage bias on the source of the depletion mode transistor, the gate-source voltage becomes increasingly negative. The depletion mode transistor switches to the off-state (i.e. its resistance is greatly increased) as the source voltage approaches the device threshold voltage.

According to a further aspect of the present disclosure, there is provided a method of manufacturing a III-nitride semiconductor based heterojunction power device, the method comprising:

forming a substrate;

forming a first III-nitride semiconductor region formed over the substrate, wherein the first III-nitride semiconductor region comprises a first heterojunction comprising at least one two-dimensional carrier gas;

forming a first terminal operatively connected to the first III-nitride semiconductor region;

forming a second terminal laterally spaced from the first terminal and operatively connected to the first III-nitride semiconductor region;

forming a first plurality of highly doped semiconductor regions over the first III-nitride semiconductor region, between the first terminal and the second terminal; and forming a first active gate region over the first plurality of highly doped semiconductor regions; (include details e.g. masks, deposition etc in summary);

forming a second III-nitride semiconductor region formed over the substrate, wherein the second III-nitride semiconductor region comprises a second heterojunction comprising at least one two-dimensional carrier gas;

forming a third terminal operatively connected to the second III-nitride semiconductor region;

forming a fourth terminal laterally spaced from the third terminal in a first dimension and operatively connected to the second III-nitride semiconductor region;

forming a second plurality of highly doped semiconductor regions over the second III-nitride semiconductor region, between the third terminal and the fourth terminal; and forming a second active gate region over the second plurality of highly doped semiconductor regions, wherein one of the first and second heterojunction transistors is an enhancement mode field effect transistor and the other of the first and second heterojunction transistors is a depletion mode field effect transistor.

The first plurality of highly doped semiconductor regions (in the enhancement mode transistor) and the second plurality of highly doped regions (in the depletion mode transistor) may be manufactured in the same process step. The difference between continuous highly doped semiconductor regions and discontinuous highly doped semiconductor regions may be realized by a layout change of the same mask. Furthermore, the threshold voltage of the normally-off enhancement mode transistor (featuring a continuous layer) could be the same as that of the second threshold voltage of the normally-on depletion mode transistor. The ability to form an enhancement mode and depletion mode device without any additional process steps is advantageous due to cost considerations and facilitates the integration of the first heterojunction transistor and the second heterojunction transistor.

This allows the integration of a high voltage depletion mode GaN device with a high voltage enhancement mode GaN device through a fabrication process which could not be used to form a high voltage depletion mode device with a Schottky contact directly on the top AlGaN layer. In state-of-the-art devices the devices would have to be manufactured using additional process steps, and the monolithically integration would be cumbersome.

DETAILED DESCRIPTION OF THE PREFERRED EMBODIMENTS

The present disclosure will be understood more fully from the accompanying drawings, which however, should not be taken to limit the disclosure to the specific embodiments shown, but are for explanation and understanding only.

Figure 6:
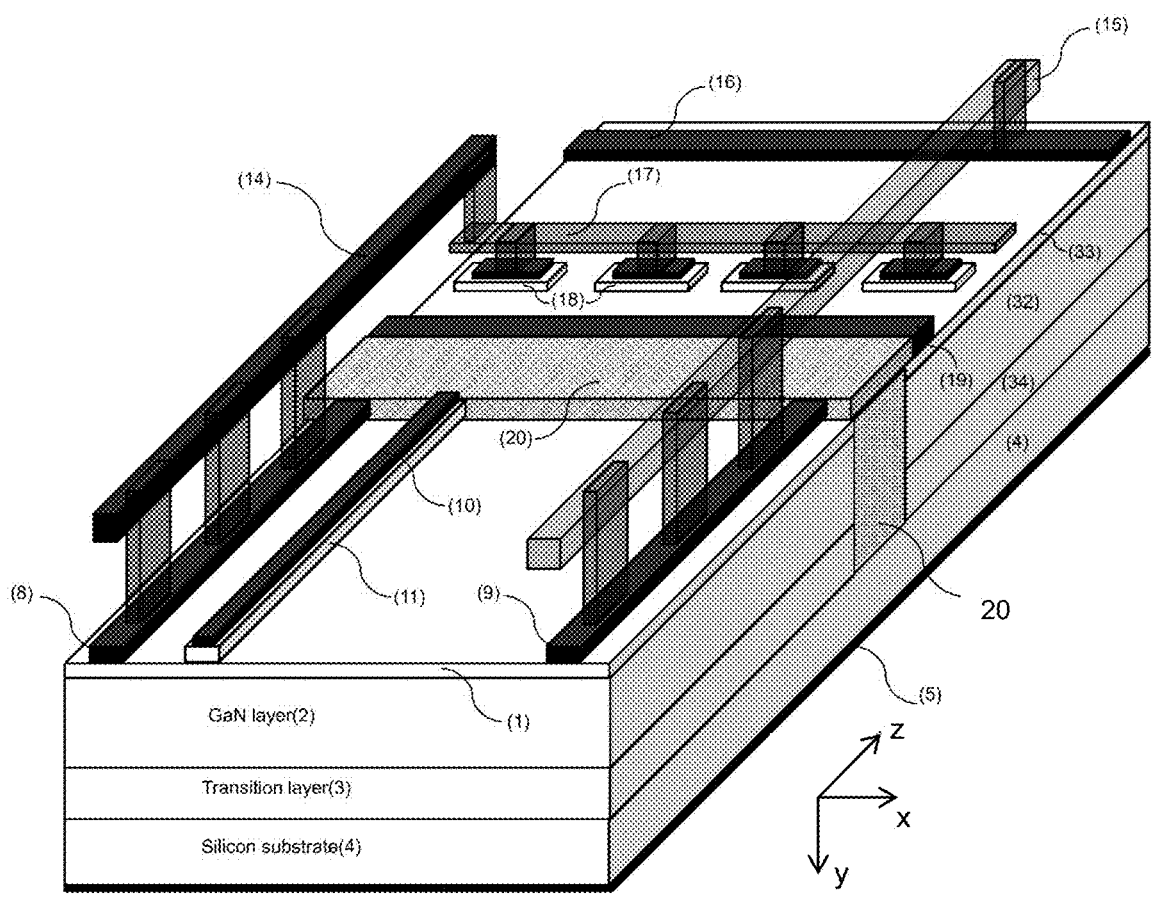
FIG. 6 shows a schematic perspective view of a device according to an embodiment of the present disclosure.

FIG. 6 shows a schematic perspective view of the active area of a GaN based semiconductor device according to an embodiment of the present disclosure. The device is presented in three dimensions: a first dimension (z-direction), a second dimension (x-direction) and a third dimension (y-direction).

In this embodiment, the device comprises a semiconductor (e.g. silicon) substrate 4 defining a major (horizontal) surface at the bottom of the device. It will be appreciated that any other substrates for GaN devices can be used. Examples of alternative substrate material are Sapphire, Silicon Carbide, and GaN.

Below the substrate 4 there is a substrate terminal 5. The device includes a transition layer 3, 34 formed on top of the semiconductor substrate 4. The transition layer 3, 34 comprises a combination of III-V semiconductor materials acting as an intermediate step to allow the subsequent growth of regions of high quality III-V semiconductor materials. The transition layer, also known as a buffer layer, 3, 34 may comprise a single layer of $Al_xGa_{1-x}N$ (with x varying between 0 and 1) or any composition of $Al_xGaN_{1-x}N/GaN$ creating a multilayer stack. It will be appreciated that the buffer layer 3, 34 may not be used in the device, particularly when the substrate 4 is not Si.

On top of the transition layer 3, 34 there is formed a semiconductor region. The semiconductor region comprises several layers. A first semiconductor layer 2, 32 is of high quality III-V semiconductor (for example GaN) and this may comprise several layers itself. The GaN semiconductor layer 2, 32 is grown on top of the buffer 3, 34/substrate 4 stack using a suitable growth technique. Examples of these are Metal-Organic Chemical Vapour Deposition (MOCVD) and Molecular Beam Epitaxy (MBE).

A further semiconductor layer 1, 33 of III-V semiconductor containing a mole fraction of Aluminium is formed on top of the first semiconductor layer 2, 32. The AlGaN layer 1, 33 is formed such that a hetero-structure is formed at the interface between the GaN layer 2, 32 and the AlGaN layer 1, 33 resulting in the formation of a two dimensional electron gas (2DEG).

The device is formed of a high voltage enhancement mode field effect transistor acting as the main power switch and a high voltage depletion mode field effect transistor acting as a start-up component. The enhancement mode transistor and the depletion mode transistor are separated by an isolation region 20. It prevents undesirable conduction between the two transistors.

The enhancement mode transistor includes a high voltage drain terminal 9 arranged in physical contact with the AlGaN layer 1. The high voltage drain terminal 9 forms an Ohmic contact to the 2DEG. A low voltage source terminal 8 is also arranged in physical contact with the AlGaN layer 1 and also forms an Ohmic contact to the 2DEG.

The enhancement mode transistor includes a region of highly p-doped III-V semiconductor 11 formed in contact with the AlGaN semiconductor layer 1. This is formed of p-GaN material in this embodiment. A gate control terminal 10 is configured over the highly doped region 11. The gate terminal consists of a metal contact placed on the p-GaN region 11. The highly doped region 11 is a continuous layer (stripes, or closed shapes around the cells) of a p-type GaN semiconductor placed on the AlGaN layer 1, and the p-type GaN semiconductor 11 is electrically connected to the gate electrode 10. The depletion mode transistor also includes a high voltage drain terminal 16 arranged in physical contact with the AlGaN layer 33. The high voltage drain 16 terminal forms an Ohmic contact to the 2DEG. A low voltage source terminal 19 is also arranged in physical contact with the AlGaN layer 33 and also forms an Ohmic contact to the 2DEG. The drain 16 and source 19 terminals consist of Ohmic metal contacts on the surface of AlGaN layer 33 or directly in contact with a good electrical connection to the 2DEG.

Regions of highly p-doped III-V semiconductor 18 are formed in contact with the AlGaN semiconductor layer 33. These have the function of reducing the 2DEG carrier concentration under the highly doped regions 18 when the device is unbiased, and are formed of p-GaN material in this embodiment. The p-GaN regions 18 are discrete regions and are spaced from each other in the 2nd dimension (the x-direction). The p-GaN regions 18, also known as p-GaN islands, extend in the x-direction in a discontinuous line. The discontinuous layer of a p-type GaN gate is made of islands placed within stripes or closed shapes. The highly p-doped GaN regions 18 may be Magnesium (Mg) doped. The highly p-doped GaN regions 18 extend along an axis which is perpendicular to the axis connecting the source terminal 19 and the drain terminals 16, where the current flows.

The highly doped layer 18 in the discontinuous gate structure of the depletion mode device may be manufactured in the same process step as the highly doped layer 11 of the enhancement mode device. All p-GaN layers (continuous or discontinuous) can be done in the same process step. The difference between continuous and discontinuous layers is realized by a layout change of the same mask.

A gate control terminal 17 is configured over the highly doped regions 18 in order to control the carrier density of the 2DEG at the interface of the semiconductor layers 33, 32. All the p-GaN islands 18 of the depletion mode device are connected to the same gate electrode 17. The gate terminal 17 consists of metal contacts placed on the intermittent regions of the p-GaN islands 18. The electrical connection between the high voltage terminal (drain) 16 and the low voltage terminal (source) 19 is determined by a voltage signal applied on the third terminal (gate) 17. The gate control terminal 17 can be either an Ohmic contact or a Schottky contact.

The discontinuous layer of a p-type GaN gate 17, 18 of the depletion mode transistor is connected to the source terminal 8 of the high voltage enhancement mode field effect transistor. Therefore the source terminal 8 of the enhancement mode transistor is electrically connected to the gate terminal 17 of the depletion mode transistor.

The drain terminal 9 of the enhancement mode transistor is connected to the drain terminal 16 of the depletion mode transistor.

The source terminal 19 of the depletion mode transistor is connected to an internal or external decoupling capacitor (not shown) such that the capacitor is being charged when the depletion mode transistor is in the on-state. As the de-coupling capacitor becomes increasingly charged (raising the voltage bias on the source 19 of the depletion mode transistor) the gate-source voltage of the depletion mode transistor becomes increasingly negative. The depletion mode transistor switches to the off-state (i.e. its resistance is greatly increased) as the source 19 voltage approaches the device threshold voltage.

Figure 7A:
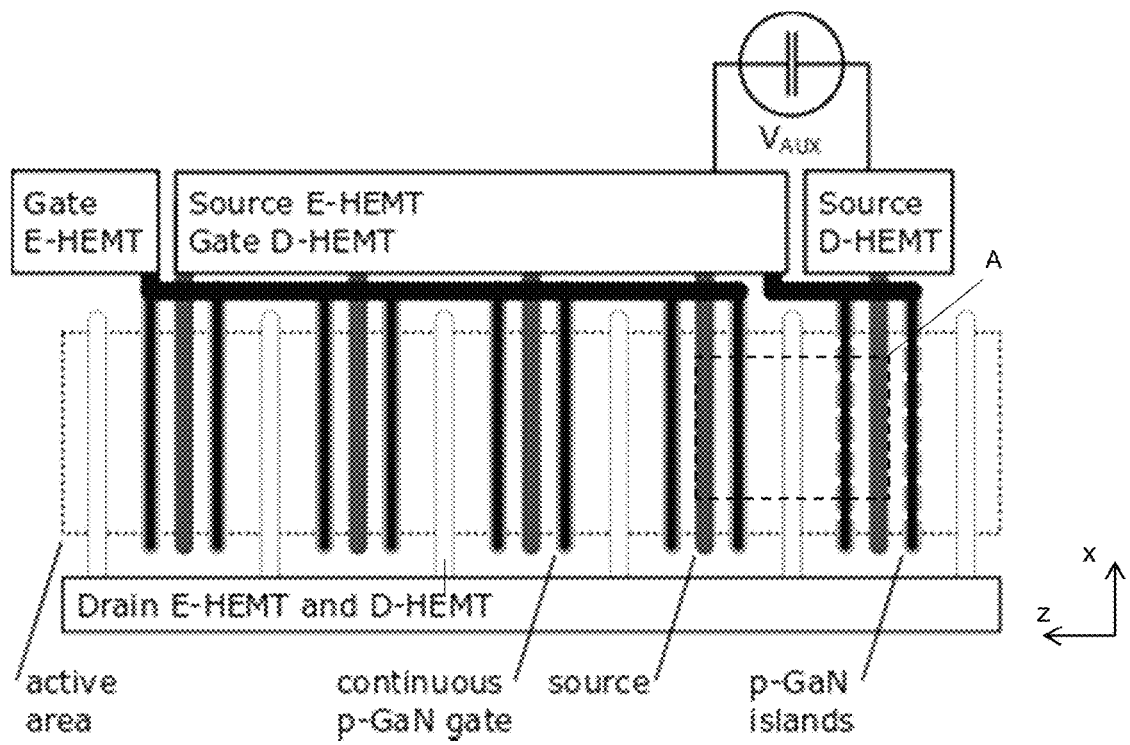
FIG. 7A shows a top view of a device according to a further embodiment of the present disclosure, in which a high voltage transistor and a depletion mode transistor share the same active area.

FIG. 7A shows a top view of a device according to a further embodiment of the present disclosure, in which a high voltage enhancement mode transistor and a depletion mode transistor share the same active area. This figure shows the device in two dimensions: a first dimension (z-direction) and a second dimension (x-direction). This top view of the device shows the high voltage main transistor and the depletion mode transistor. The continuous p-GaN stripes 11 are present in the gate 10 of the main, enhancement transistor while discontinuous stripes 18 are present in the gate 17 of the depletion mode transistor. The pad layout is shown. The gate 17 of the depletion mode transistor and the source 8 of the main switch share the same pad. The two devices share the same active area and there is no specific separation between them, other than the drain region 9, 16. At the boundary, one side of the drain belongs to the main switch while the other side of the drain belongs to the depletion mode transistor.

Figure 7B:
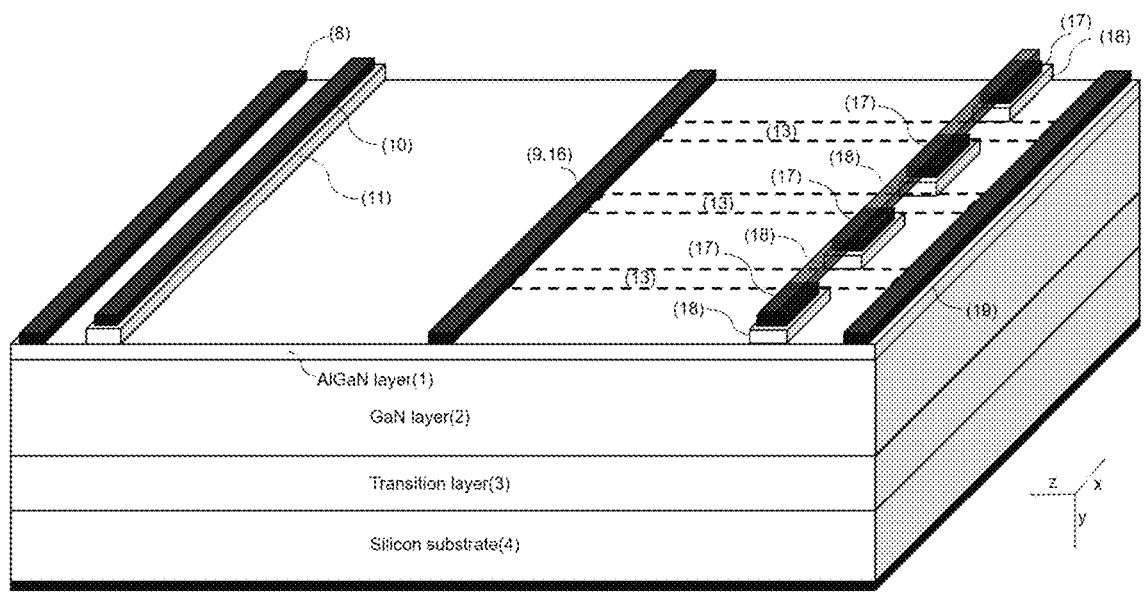
FIG. 7B shows a schematic perspective view of a portion of the device shown in FIG. 7A.

FIG. 7B shows a schematic perspective view of a portion of the device shown in FIG. 7A, indicated by the area A.

Figure 8:
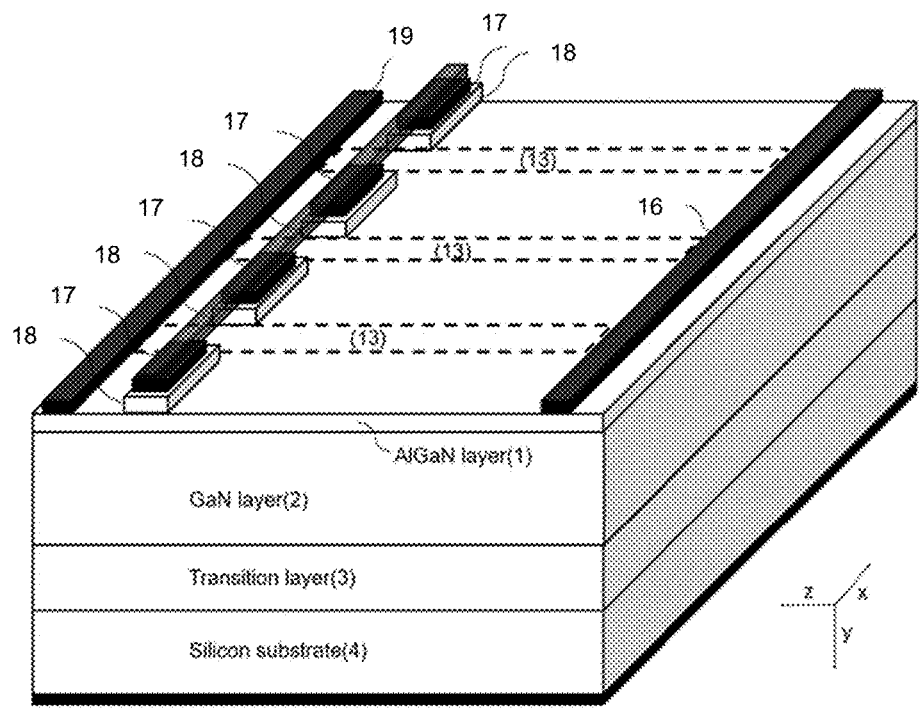
FIG. 8 shows a schematic perspective view of a depletion mode device used as a component in an integrated device according to an embodiment of the disclosure.

FIG. 8 shows a schematic perspective view of a depletion mode device used as a component in an integrated device according to an embodiment of the disclosure.

The 2DEG is formed along the interface between the GaN layer 2 and the AlGaN layer 1. The gate structure of a discontinuous p-GaN layer containing islands 18 within a stripe modulates the conductive path between the high voltage drain terminal 16 and the low voltage source terminal 19, when a gate voltage is provided. By discontinuous islands, it is meant that between adjacent islands 18 there is no p-GaN layer present, and as such, there is a direct, unobstructed conductive path 13 between the source terminal 19 and the drain terminal 16. However, adjacent islands 18 within a stripe are placed closed enough together across (orthogonal to) the current path 13 such that the potential applied to the gate terminal 17 modulates the conductive region 13 between the islands 18 and thus modulates the direct path between the source 19 and the drain 16.

The conductive channel between the drain terminal 16 and the source terminal 19 is a two-dimensional electron gas which is formed at the interface of the AlGaN/GaN heterostructure 1, 2. The p-doped GaN islands 18 are placed on the AlGaN surface 1 of the heterojunction and at zero gate terminal bias create a depletion of the conductive channel (2DEG) under the heterojunction. An uninterrupted channel is present at zero bias between the source terminal 19 and the drain terminal 16 along the paths 13 where the p-doped GaN layer 18 is not present (between the islands 18). At zero bias the conduction channel is present in regions where the p-GaN layer 18 is not present vertically above.

When negative bias is applied to the gate terminal 17 with respect to the source terminal 19, the carrier concentration in the conductive channel (region) between the drain terminal 16 and the source terminal 19 is reduced due to the lateral electric field extending from the p-doped GaN islands 18 to the regions between the islands. The lateral electric field is formed in the x-direction, perpendicular to the axis connecting the source 19 and drain 16 terminals. This lateral field depletes the 2DEG and thus increases the 2DEG resistance between the source 19 and the drain 16. The critical gate bias value at which the device is considered to move from the on-state (low resistance) to the off-state (high resistance) is defined as the first threshold voltage. Note that instead of applying a negative potential to the gate 17, it is also possible to keep the gate 17 grounded and apply a positive potential to the source 19 to achieve the same result. Channel modulation such that the device operates as a transistor is achieved through the lateral JFET depletion of the conductive channel in the regions where the p-GaN islands 18 are not placed vertically above, when the gate terminal 17 is increasingly negatively biased.

Parameters which affect the first threshold voltage include (but are not limited to) the separation between p-doped GaN islands 18, AlGaN layer 1 thickness and aluminium mole fraction of the AlGaN layer 1. Other parameters which affect the specific on-state resistance of the depletion mode transistors are the number of separations between p-doped GaN islands 18 and the length of the p-doped GaN islands 11 with respect to the separation between the islands.

As the discontinuous highly doped semiconductor layer of the depletion mode device is made of islands 18 and by varying the layout spacing between the discontinuous p-type islands 18, the depletion mode transistor is normally-on until its source terminal 19, connected to a capacitor, becomes elevated at a desired voltage level, after which the device turns off.

As the gate-source voltage is increased above the first threshold voltage but remaining below a second threshold voltage, the formation of the 2DEG channel spreads from the middle of the pitch between adjacent p-GaN islands 18 towards the edges of the p-GaN gate islands 18. The current continues to increase as the on-state resistance is reduced.

The depletion mode device features a second threshold voltage which is higher (more positive) than the first threshold voltage. The signature of the second threshold voltage is that of a steep current increase. This second threshold voltage level corresponds to the formation of the 2DEG directly under the p-GaN islands 18 rather than between the islands. A steep increase in the current is seen as the 2DEG spreads under the p-gate islands 18 allowing the current to flow through this region, thus resulting in an increased conduction area. The steepness (or softness) of the current at the second threshold voltage and above the second threshold voltage is reached depends on the ratio between the combined area of the pGaN islands 18 and the combined area of the regions between the pGaN islands (separations). The higher this ratio is the sharper (the steeper) the current increase. If the ratio is low, the current increase, when the second threshold voltage is reached, is smoother. As a result of the steep increase in current there is a steep decrease in the on-state resistance.

The threshold voltage of the depletion mode device can be adjusted through layout modifications in addition to epitaxy/process modifications. The depletion mode device is therefore a normally-on device (as first threshold voltage is negative), but is characterised by a second steep increase in the current when the second threshold voltage is reached. Furthermore, the normally-on, depletion mode device proposed can allow for an increased positive gate bias voltage to be applied (>7 V) before the main on-state conduction channel changes from drain-source to gate-source.

Figure 9A:
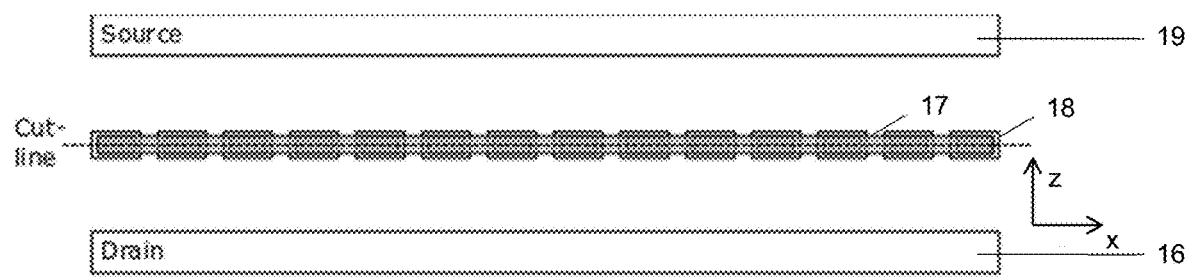
FIG. 9A shows a schematic top view of a depletion mode device used as a component in an integrated device according to an embodiment of the disclosure.

FIG. 9A shows a schematic top view of a depletion mode transistor used as a component in an integrated device according to an embodiment of the disclosure. The depletion mode transistor is similar to that shown in FIG. 8. This figure shows the device in two dimensions: a first dimension (z-direction) and a second dimension (x-direction).

Figure 9B:
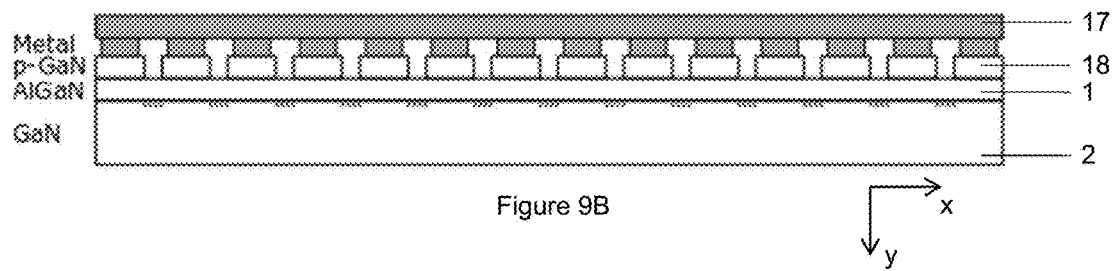
FIG. 9B shows a schematic cross section of the depletion mode device shown in FIG. 9A.

FIG. 9B shows a schematic cross section of the depletion mode device shown in FIG. 9A, along the cutline shown in FIG. 9A. This figure shows the device in two dimensions: a second dimension (x-direction) and a third dimension (y-direction).

Figure 1:
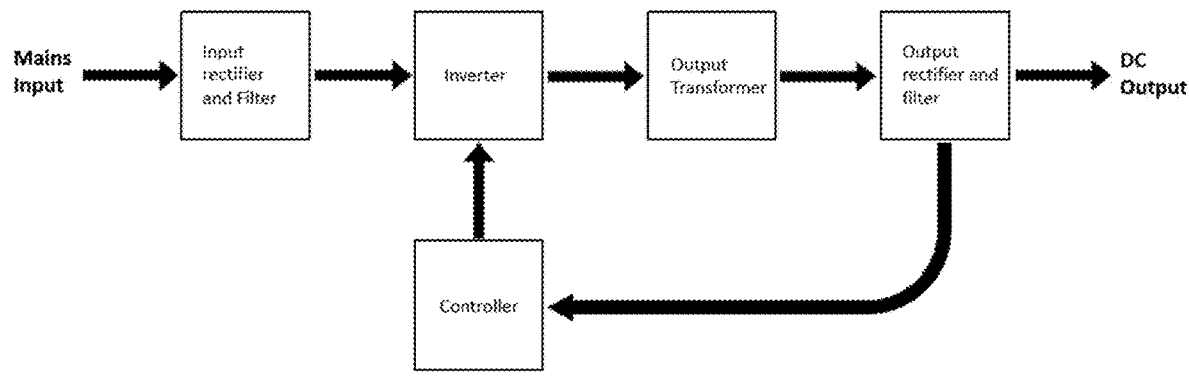
FIG. 1 shows a block diagram of a mains operated AC/DC switch mode power supply (SMPS) with output voltage regulation, according to the state-of-the-art.
Figure 2:
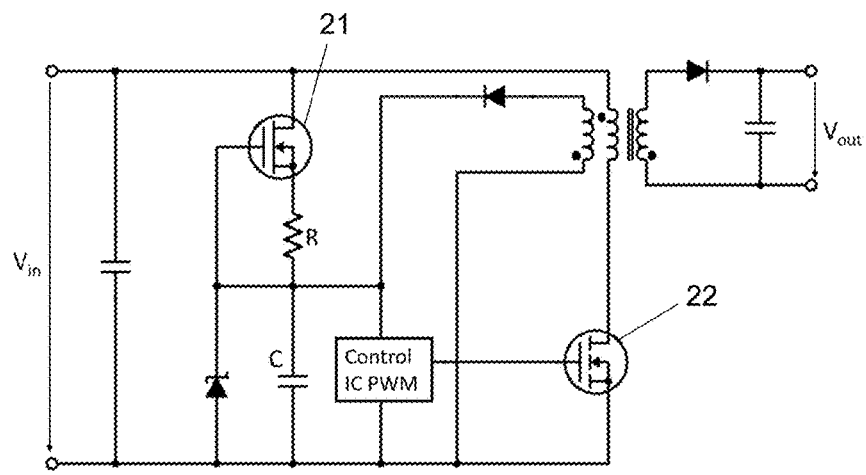
FIG. 2 shows a schematic circuit diagram of a fly-back converter with an enhancement mode power transistor acting as the main power switch and a high voltage depletion mode transistor acting as a start-up component charging the IC controller decoupling capacitor, according to the state-of-the-art.
Figure 3:
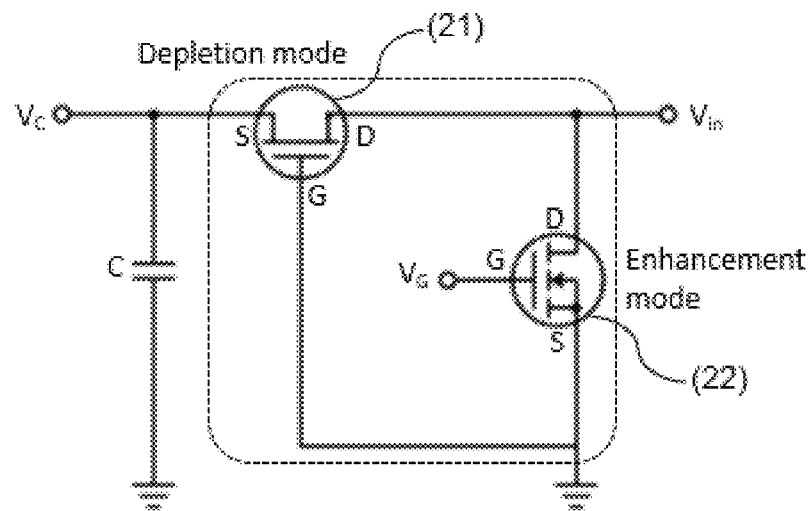
FIG. 3 shows a schematic circuit diagram of an enhancement mode power transistor and a high voltage depletion mode start-up component.
Figure 4:
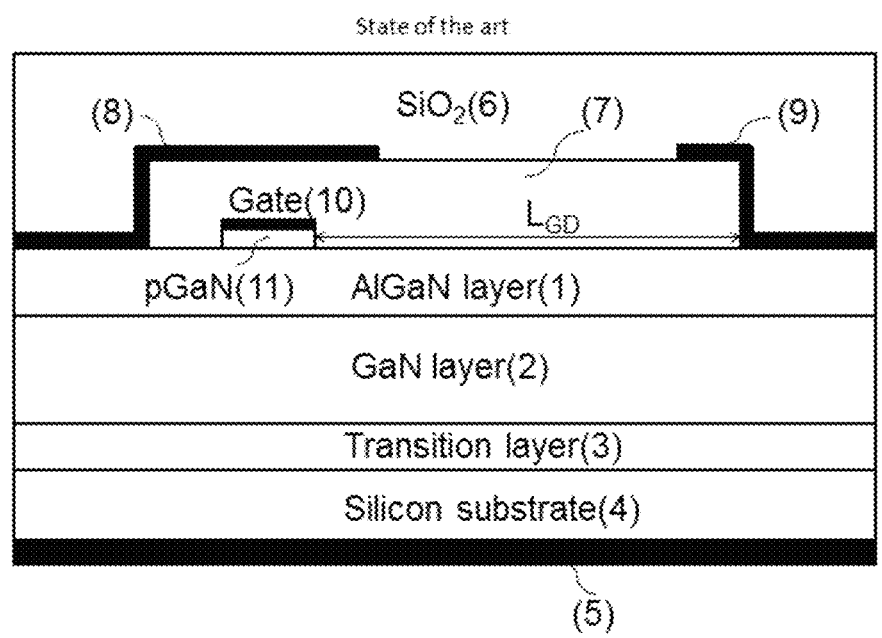
FIG. 4 shows a schematic cross section of the active area of a state-of-the-art enhancement mode p-GaN HEMT, according to the state-of-the-art.
Figure 5:
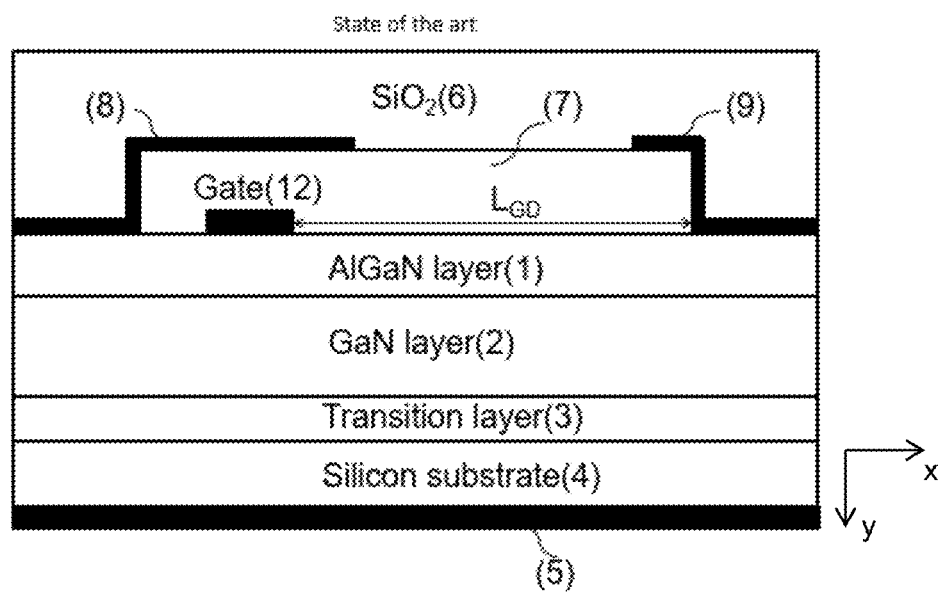
FIG. 5 shows a schematic cross section of the active area of a state-of-the-art depletion mode HEMT with a Schottky gate terminal.
Figure 10A:
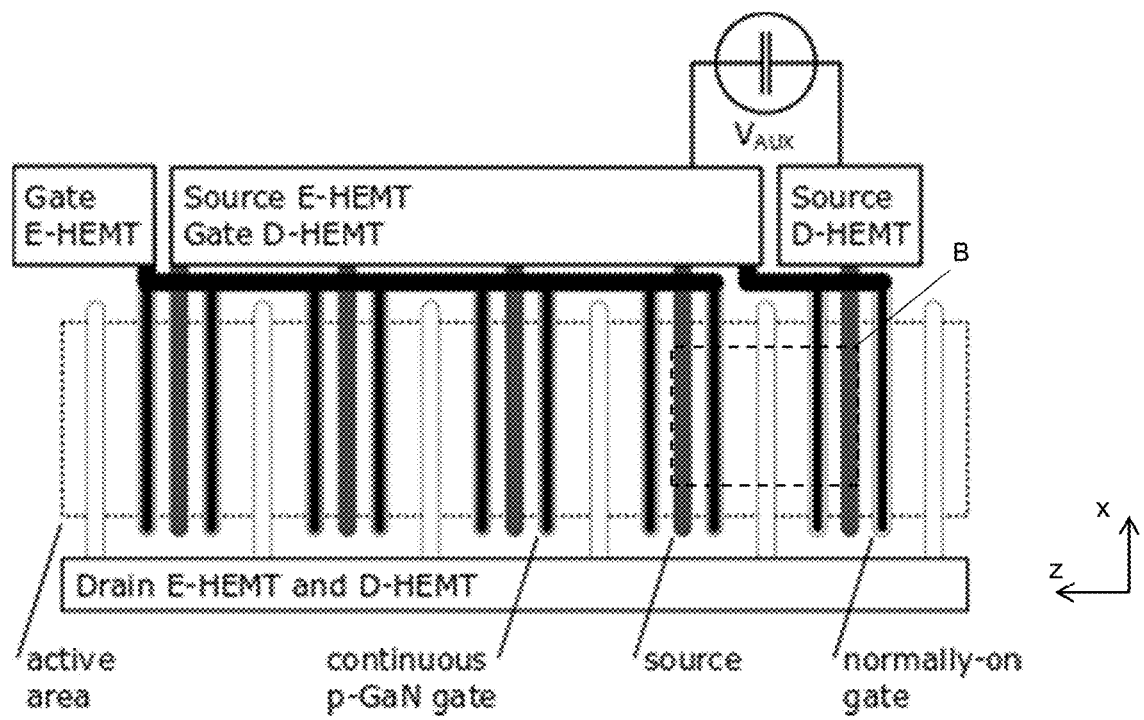
FIG. 10A shows a top view of a device according to a further embodiment of the present disclosure, in which the depletion mode device is a Schottky gate device as shown in FIG. 5.

FIG. 10A shows a top view of a device according to a further embodiment of the present disclosure, in which the depletion mode device is a Schottky gate device as shown in FIG. 5. This figure shows the device in two dimensions: a first dimension (z-direction) and a second dimension (x-direction). In this embodiment the depletion mode device has a Schottky contact 12 as the gate contact.

Figure 10B:
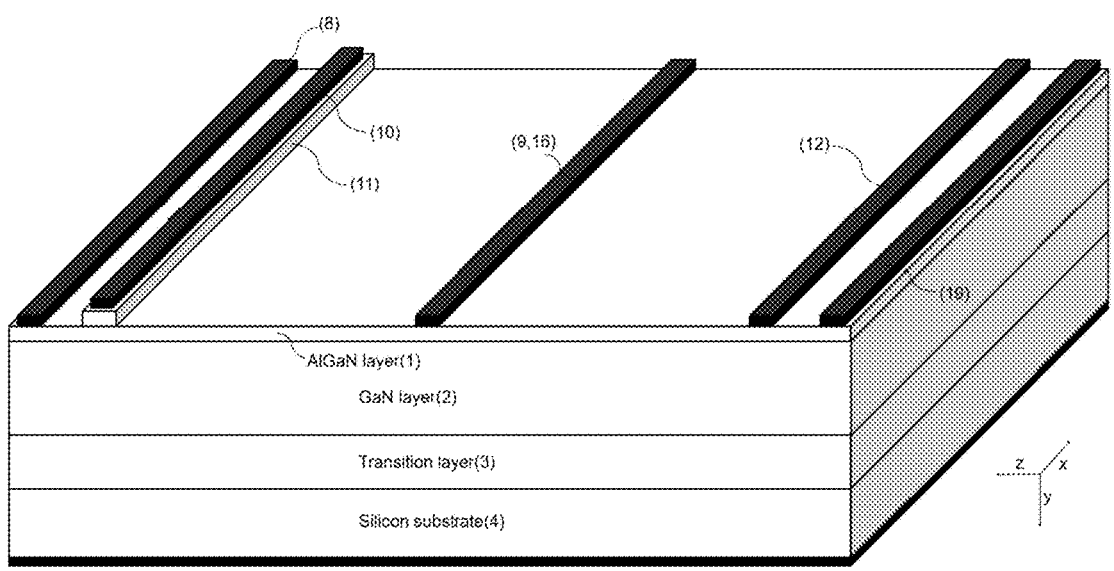
FIG. 10B shows a schematic perspective view of a portion of the device shown in FIG. 10A.

FIG. 10B shows a schematic perspective view of a portion of the device shown in FIG. 10A. The device is presented in three dimensions: a first dimension (z-direction), a second dimension (x-direction) and a third dimension (y-direction).

Figure 11:
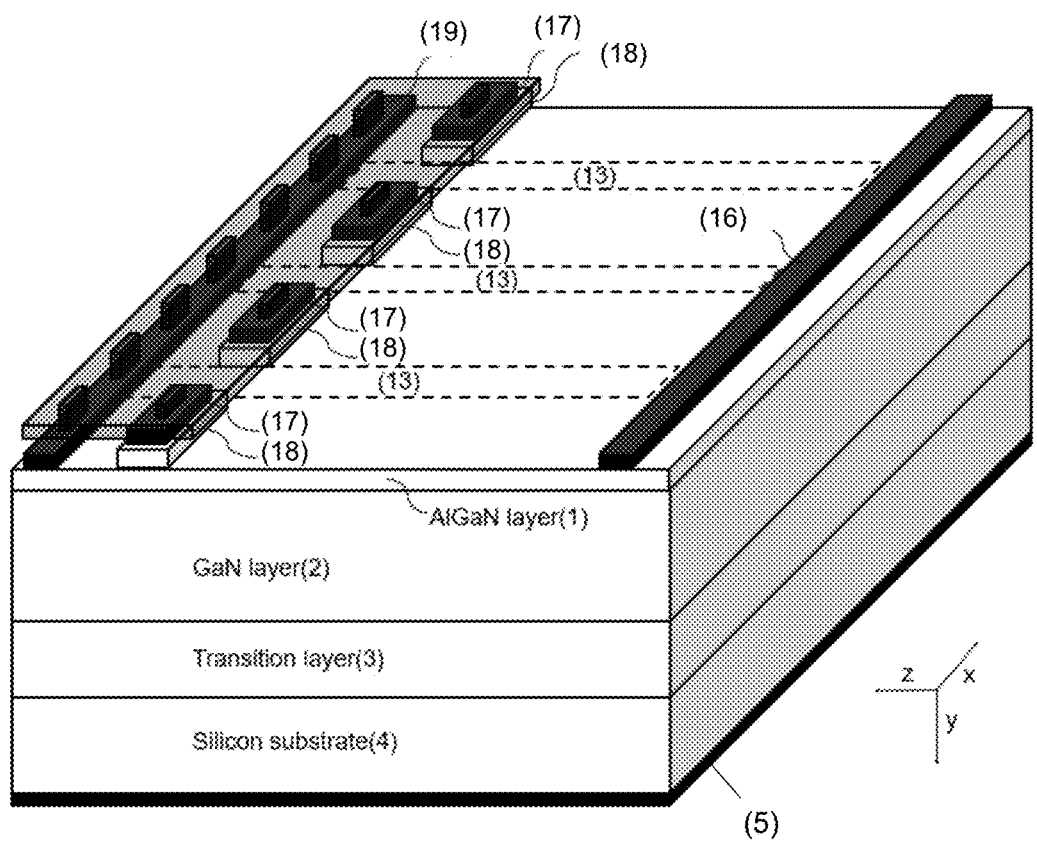
FIG. 11 shows a schematic perspective view of a depletion mode device configured to operate in diode mode used as a component in an integrated device according to an embodiment of the disclosure.

FIG. 11 shows a schematic perspective view of a depletion mode device configured to operate in diode mode used as a component in an integrated device according to an embodiment of the disclosure. The device is presented in three dimensions: a first dimension (z-direction), a second dimension (x-direction) and a third dimension (y-direction). In this embodiment, the normally-on depletion mode MOSFET with discontinuous p-GaN islands 18 is configured to be used in a diode mode, by connecting the gate 17 and source 19 together. Alternatively, this can be done by connecting the drain 16 and gate 17 together.

The distance (pitch) between the p-GaN islands 18 can be used to adjust the voltage level at which the diode conducts current in the forward mode. This is particularly advantageous over the state-of-the-art devices where a continuous p-GaN layer is used, which results in a large forward voltage. For example, the pitch between adjacent p-GaN islands 18 (or adjacent pluralities of p-GaN islands in embodiments of the device with multiple stripes of p-GaN islands) can be used to adjust the opening forward voltage to be about 0.3 V to 0.5 V, which is specific to Schottky diodes in silicon. Schottky diodes are known to be more efficient than bipolar diodes as they offer lower opening forward voltage and very low reverse recovery losses. To avoid a negative opening voltage, which is undesirable for a diode, the pitch between adjacent p-GaN islands 18 in this embodiment is very small (in the orders of tens or hundreds of nanometres).

A second increase in the current is present at a higher voltage level (higher than the opening voltage level) during forward conduction, when the 2DEG under the p-GaN layer 18 is formed. In order to minimise the on-state resistance in forward conduction, the diode may operate beyond the second threshold voltage.

The diode shown in this embodiment, with source 19 and gate 17 operatively connected to each other and with a drift region present between the drain side of the gate edge 17 and the drain terminal 16, can be used as a high voltage diode. The diode can also be used as a free-wheeling or anti-parallel diode and can also be monolithically integrated with a normally-off GaN based HEMT.

Figure 12A:
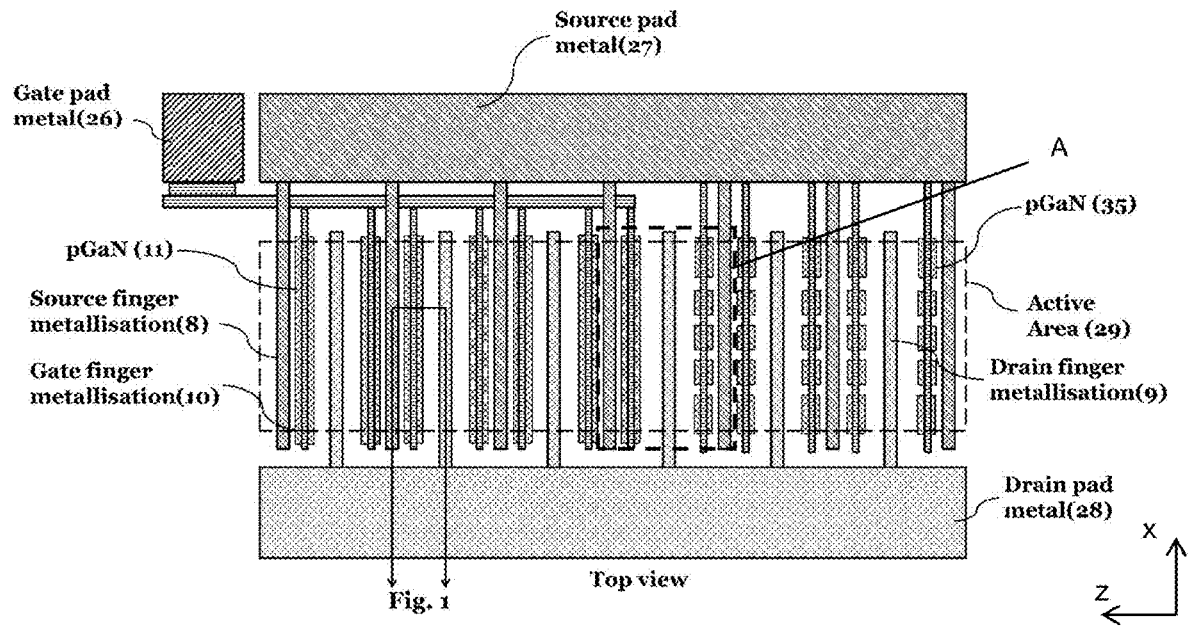
FIG. 12A shows a schematic top view of the layout of a power HEMT with a continuous p-GaN gate monolithically integrated with an anti-parallel diode with a discontinuous p-GaN gate, according to an embodiment of the present disclosure.

FIG. 12A shows a schematic top view of the layout of a power HEMT with a continuous p-GaN gate layer 11 which is monolithically integrated with an anti-parallel diode with a discontinuous p-GaN gate 35, according to an embodiment of the disclosure. The device is presented in three dimensions: a first dimension (z-direction), a second dimension (x-direction) and a third dimension (y-direction). This top view of the device shows the high voltage main transistor and the depletion mode transistor. The continuous p-GaN stripes 11 are present in the gate 10 of the main, enhancement transistor while discontinuous stripes 35 are present in the gate 17 of the diode. The two devices share the same active area and there is no specific separation between them, other than the drain region 9, 16. At the boundary, one side of the drain belongs to the main switch while the other side of the drain belongs to the depletion mode transistor.

Figure 12B:
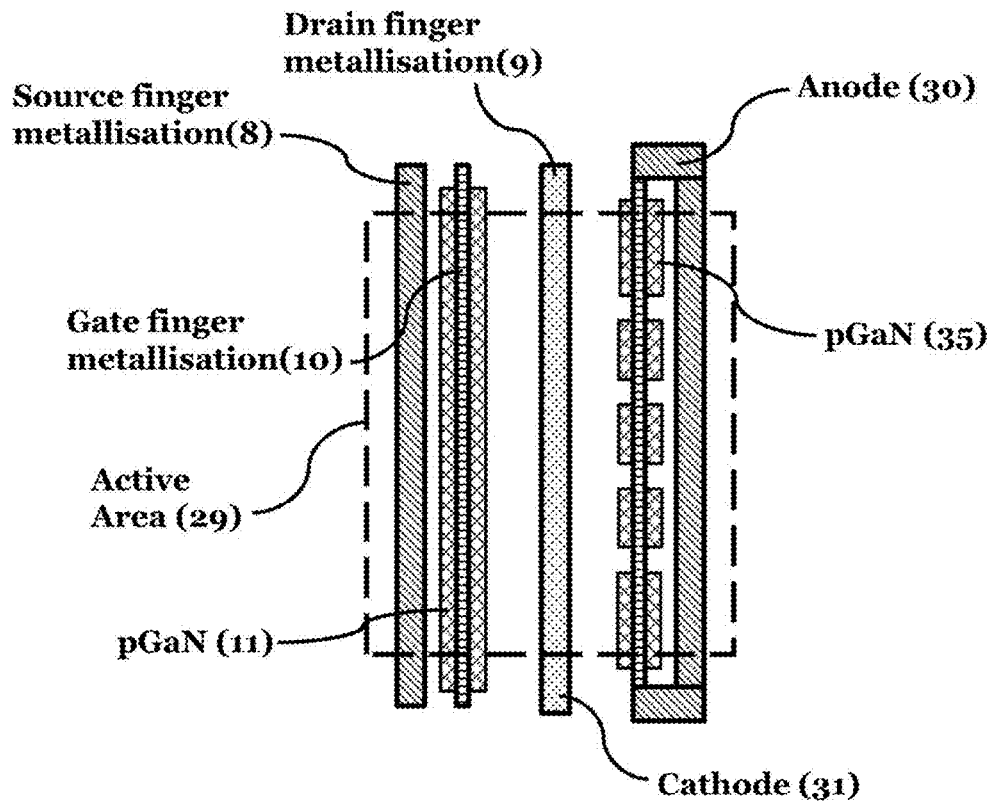
FIG. 12B shows a schematic top view of the layout of a unit cell of the integrated HEMT/anti-parallel diode device shown in FIG. 12A.
Figure 13:
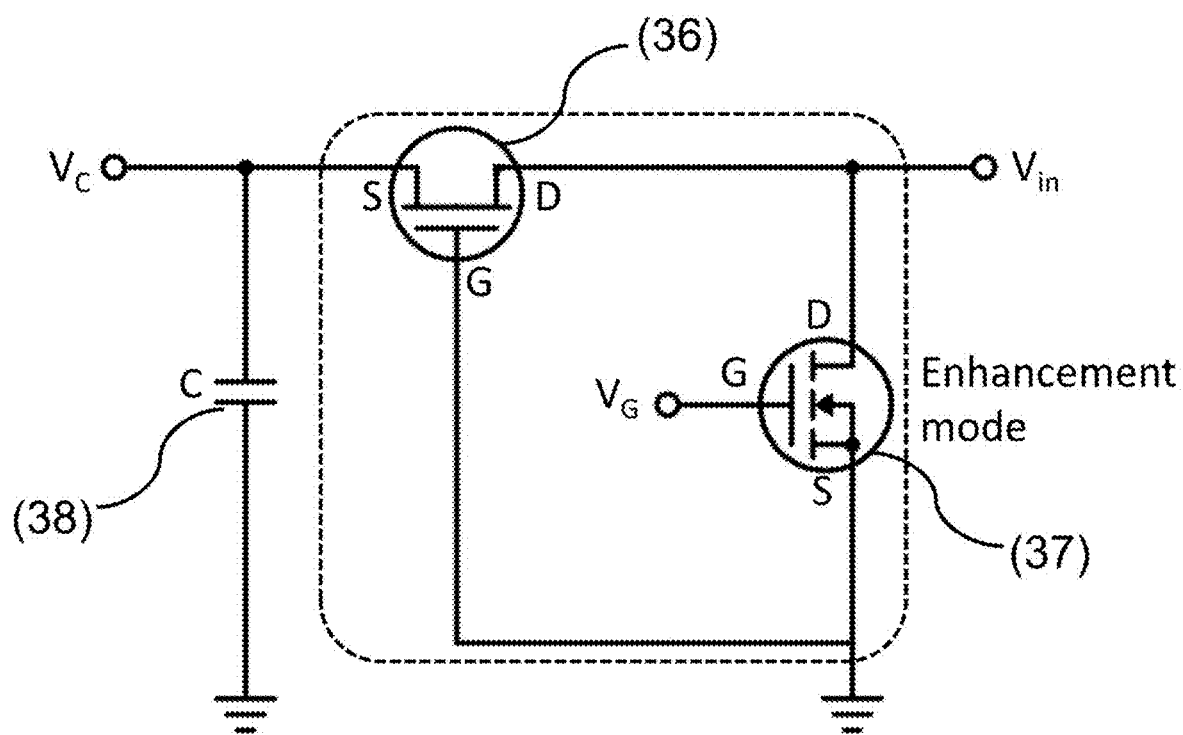
FIG. 13 shows a circuit comprising a III-nitride semiconductor based heterojunction power device according to the present disclosure, and further comprising a capacitor.
Figure 14:
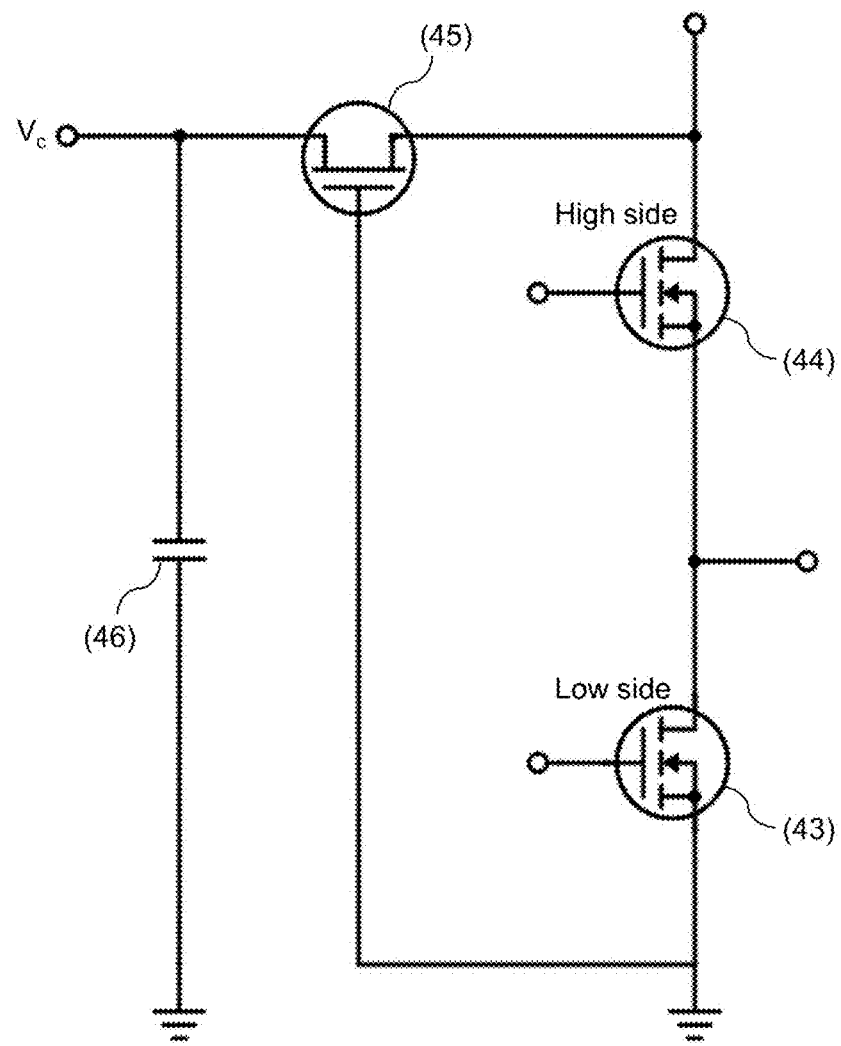
FIG. 14 shows a circuit comprising two III-nitride semiconductor based heterojunction power devices according to the present disclosure arranged in a half bridge configuration.
Figure 15:
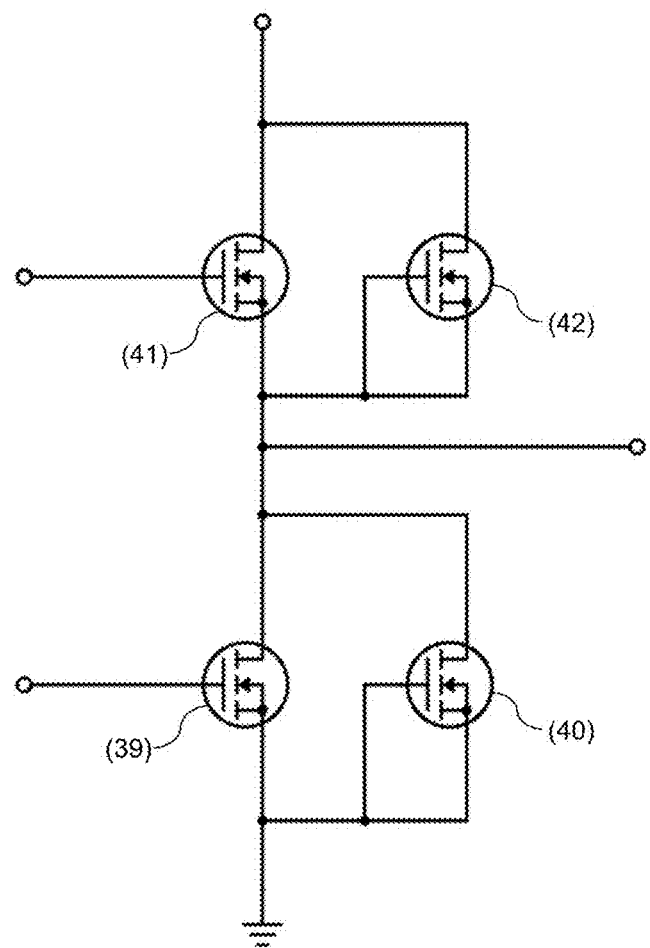
FIG. 15 shows a circuit comprising at least two III-nitride semiconductor based heterojunction power devices according to the present disclosure connected in an anti-parallel configuration and arranged in a half bridge configuration.

FIG. 12B shows a schematic top view of the layout of a unit cell of the integrated HEMT/anti-parallel diode device shown by cell A in FIG. 12A. This figure shows the device in two dimensions: a first dimension (z-direction) and a second dimension (x-direction).

This shows a multiple finger structure used to integrate an anti-parallel diode with discontinuous p-GaN islands 35. The diode in this example is a diode according to an embodiment of the disclosure, as shown in FIG. 11. The main HEMT device is a normally-off device using a continuous p-GaN layer 11 connected to the gate 26 of the device. The diode (which has its source 19 and its internal gate 17 connected together) features discontinuous p-GaN islands 35. In this particular lay-out example (shown here in top view), in individual finger structures, one side of the drain is part of the main power device, the normally-off p-GaN HEMT, while the other side of the drain 16 acts as the cathode 31 of the anti-parallel diode. The anti-parallel diode has the anode 30 terminal formed as its internal source 19 and internal gate 17 connected together. The drain of the main HEMT is connected to the cathode 31 (drain 16) of the anti-parallel diode while the source of the main HEMT is connected to the anode (source 19 and gate 17) of the anti-parallel diode.

When the main HEMT device is in the on-state (with an appropriate gate bias and the drain bias above the source bias) the anti-parallel diode is off. The diode is in forward conduction (on-state) when the source terminal of the HEMT, which is connected to anode 30 of the diode, is at a higher voltage than the drain of the HEMT, which is connected to the cathode 31 of the diode. In this embodiment, the opening voltage of the diode can be controlled by the pitch (distance) between adjacent p-GaN islands 35. In order to enable a transversal depletion region to deplete the 2DEG between the p-GaN islands 35 when the anode terminal 30 is at 0 V (the internal source-gate of the diode is at 0 V), the pitch between adjacent p-GaN islands 35 is very small.

Alternatively, the source terminal 19 of the diode can be configured as a Schottky contact to avoid the diode having a zero or negative opening voltage. In this case the p-GaN islands 35 also serve to lower the leakage in the off-state, lowering the leakage due to tunnelling through the Schottky contact in the blocking mode (reverse bias of the diode) and pushing the electric field away from the Schottky contact (the anode of the diode), towards the cathode.

The gate contact 17 to the p-GaN islands 35 can be made of Ohmic or Schottky metallisation. The Schottky contact has the advantage of smaller gate leakage currents, while the Ohmic contact is beneficial to increase stability of the device, and to passivate traps in the AlGaN and GaN buffers by hole injection.

Additionally, the diode mode device described here can be used in the pull-down network during turn-off of the auxiliary gate device described in the PCT publication WO/2019/012293A1 and which is incorporated herein by reference in its entirety.

LIST OF REFERENCE NUMERALS

1 AlGaN layer
2 GaN layer
3 Transition layer
4 Substrate
5 Substrate terminal
6 SiO$_2$ passivation
7 Surface passivation dielectric
8 Enhancement mode source terminal
9 Enhancement mode drain terminal
10 Enhancement mode gate terminal
11 Enhancement mode p-GaN cap
12 Schottky gate terminal
13 Conduction channel at zero bias
14 Enhancement mode source terminal to depletion mode gate terminal connection
15 Enhancement mode drain terminal to depletion mode drain terminal connection
16 Depletion mode drain terminal
17 Depletion mode gate terminal
18 Depletion mode p-GaN regions
19 Depletion mode source terminal
20 Isolation
21 Depletion mode device
22 Enhancement mode device
26 Gate pad metal
27 Source pad metal
28 Drain pad metal
29 Active area
30 Diode anode
31 Diode cathode
32 AlGaN layer
33 GaN layer
34 Transition layer
35 pGaN
36 Depletion mode device with pGaN regions
37 Enhancement mode device 38 Capacitor
39 Enhancement mode device
40 Anti-parallel transistor configured as diode
41 Enhancement mode device
42 Anti-parallel transistor configured as diode
43 Low side enhancement mode device
44 High side enhancement mode device
45 Depletion mode device with pGaN regions
46 Capacitor The skilled person will understand that in the preceding description and appended claims, positional terms such as 'top', 'above', 'overlap', 'under', 'lateral', etc. are made with reference to conceptual illustrations of a device, such as those showing standard cross-sectional perspectives and those shown in the appended drawings. These terms are used for ease of reference but are not intended to be of limiting nature. These terms are therefore to be understood as referring to a device when in an orientation as shown in the accompanying drawings.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the disclosure, whether alone or in any appropriate combination with any other feature disclosed or illustrated herein.

Many other effective alternatives will occur to the person skilled in the art. It will be understood that the disclosure is not limited to the described embodiments, but encompasses all the modifications which fall within the spirit and scope of the disclosure.

The invention claimed is:

1. A III-nitride semiconductor based heterojunction power device, comprising:
a first heterojunction transistor formed on a substrate, the first heterojunction transistor comprising:
a first III-nitride semiconductor region formed over the substrate, wherein the first III-nitride semiconductor region comprises a first heterojunction comprising at least a first two dimensional carrier gas of a second conductivity type;
a first terminal operatively connected to the first III-nitride semiconductor region;
a second terminal laterally spaced from the first terminal and operatively connected to the first III-nitride semiconductor region;
a first highly doped semiconductor region of a first conductivity type formed over the first III-nitride semiconductor region, and between the first terminal and the second terminal;
a first gate region being formed over the first highly doped semiconductor region, and between the first terminal and the second terminal; and
a second heterojunction transistor formed on the substrate, the second heterojunction transistor comprising:
a second III-nitride semiconductor region formed over the substrate, wherein the second III-nitride semiconductor region comprises a second heterojunction comprising at least a second two dimensional carrier gas of the second conductivity type;
a third terminal operatively connected to the second III-nitride semiconductor region;
a fourth terminal operatively connected to the second III-nitride semiconductor region, wherein within an active area of the second heterojunction transistor the fourth terminal is laterally spaced from the third terminal in a first dimension;
a second plurality of highly doped semiconductor regions of the first conductivity type formed over the second III-nitride semiconductor region, the second plurality of highly doped semiconductor regions being formed between the third terminal and the fourth terminal, wherein the second plurality of highly doped semiconductor regions comprises at least two highly doped semiconductor regions of the first conductivity type in contact with the second III-nitride semiconductor region and laterally spaced from each other in a second dimension that is perpendicular to the first dimension;
a second gate region operatively connected to the first plurality of highly doped semiconductor regions, and
wherein one of the first heterojunction transistor and the second heterojunction transistor is an enhancement mode field effect transistor and the other one of the first heterojunction transistor and the second heterojunction transistor is a depletion mode field effect transistor.

2. The III-nitride semiconductor based heterojunction power device according to claim 1, wherein the first heterojunction of the first III-nitride semiconductor region comprises:
a first III-nitride semiconductor layer having a first band gap formed over the substrate;
a second III-nitride semiconductor layer having a second bandgap different from the first band gap disposed on the first III-nitride semiconductor layer; and
at least the first two-dimensional carrier gas of the second conductivity type formed at an interface between the first III-nitride semiconductor layer and the second III-nitride semiconductor layer to provide a channel; and
wherein the second heterojunction of the second III-nitride semiconductor region comprises:
a third III-nitride semiconductor layer having a third band gap formed over the substrate;
a fourth III-nitride semiconductor layer having a fourth bandgap different from the third band gap disposed on the third III-nitride semiconductor layer; and
at least the second two-dimensional carrier gas of the second conductivity type formed at an interface between the third III-nitride semiconductor layer and the fourth III-nitride semiconductor layer to provide a channel.

3. The III-nitride semiconductor based heterojunction power device according to claim 2, wherein the first III-nitride semiconductor layer, the second III-nitride semiconductor layer, the third III-nitride semiconductor layer, and the fourth III-nitride semiconductor layer each comprise any one of gallium nitride (GaN), aluminium gallium nitride (AlGaN) and indium aluminium gallium nitride (InAlGaN), and wherein at least the first two dimensional carrier gas and at least the second two dimensional carrier gas are two dimensional electron gases (2DEG) or two dimensional hole gases (2DHG).

4. The III-nitride semiconductor based heterojunction power device according to claim 1, wherein the first heterojunction transistor is configured as the enhancement mode field effect transistor, operating as a power switch and wherein the second heterojunction transistor is configured as the depletion mode field effect transistor operating as a start-up device.

5. The III-nitride semiconductor based heterojunction power device according to claim 1, wherein the second gate region comprises a Schottky contact or an Ohmic contact.

6. The III-nitride semiconductor based heterojunction power device according to claim 1, wherein the first heterojunction transistor and the second heterojunction transistor are monolithically integrated within the III-nitride semiconductor based heterojunction power device.

7. The III-nitride semiconductor based heterojunction power device according to claim 1, further comprising an isolation structure formed between the first heterojunction transistor and the second heterojunction transistor.

8. The III-nitride semiconductor based heterojunction power device according to claim 1, wherein the second terminal and the fourth terminal are operatively connected.

9. The III-nitride semiconductor based heterojunction power device according to claim 8, wherein the second terminal and the fourth terminal are configured as a self-isolating structure.

10. The III-nitride semiconductor based heterojunction power device according to claim 1, wherein the first terminal is operatively connected to the second gate region.

11. The III-nitride semiconductor based heterojunction power device according to claim 1, wherein the second heterojunction transistor is configured as a diode, with the third terminal connected to the second gate region.

12. The III-nitride semiconductor based heterojunction power device according to claim 11, wherein the diode is connected in an anti-parallel configuration to the first heterojunction transistor and where the first terminal is connected to the third terminal and the second terminal is connected to fourth terminal.

13. A circuit, comprising:
at least two III-nitride semiconductor based heterojunction power devices arranged in a half bridge configuration, each of the at least two III-nitride semiconductor based heterojunction power devices, comprising:
a first heterojunction transistor formed on a substrate, the first heterojunction transistor comprising:
a first III-nitride semiconductor region formed over the substrate, wherein the first III-nitride semiconductor region comprises a first heterojunction comprising at least a first two dimensional carrier gas of a second conductivity type;
a first terminal operatively connected to the first III-nitride semiconductor region;
a second terminal laterally spaced from the first terminal and operatively connected to the first III-nitride semiconductor region;
a first highly doped semiconductor region of a first conductivity type formed over the first III-nitride semiconductor region, and between the first terminal and the second terminal;
a first gate region being formed over the first highly doped semiconductor region, and between the first terminal and the second terminal; and
a second heterojunction transistor formed on the substrate, the second heterojunction transistor comprising:
a second III-nitride semiconductor region formed over the substrate, wherein the second III-nitride semiconductor region comprises a second heterojunction comprising at least a second two dimensional carrier gas of the second conductivity type;

a third terminal operatively connected to the second III-nitride semiconductor region;
a fourth terminal operatively connected to the second III-nitride semiconductor region, wherein within an active area of the second heterojunction transistor the fourth terminal is laterally spaced from the third terminal in a first dimension:
a second plurality of highly doped semiconductor regions of a first conductivity type formed over the second III-nitride semiconductor region, the second plurality of highly doped semiconductor regions being formed between the third terminal and the fourth terminal, wherein the second plurality of highly doped semiconductor regions comprises at least two highly doped semiconductor regions of the first conductivity type in contact with the second III-nitride semiconductor region and laterally spaced from each other in a second dimension that is perpendicular to the first dimension:
a second gate region operatively connected to the first plurality of highly doped semiconductor regions,
wherein one of the first heterojunction transistor and the second heterojunction transistor is an enhancement mode field effect transistor and the other one of the first heterojunction transistor and the second heterojunction transistor is a depletion mode field effect transistor;
wherein the second heterojunction transistor is configured as a diode, with the third terminal connected to the second gate region, and
wherein the diode is connected in an anti-parallel configuration to the first heterojunction transistor and where the first terminal is connected to the third terminal and the second terminal is connected to fourth terminal.

14. A method of manufacturing a III-nitride semiconductor based heterojunction power device, the method comprising:
forming a first III-nitride semiconductor region over a substrate, wherein the first III-nitride semiconductor region comprises a first heterojunction comprising at least a first two-dimensional carrier gas of a second conductivity type;
forming a first terminal operatively connected to the first III-nitride semiconductor region;
forming a second terminal laterally spaced from the first terminal and operatively connected to the first III-nitride semiconductor region; and
forming a first highly doped semiconductor region of a first conductivity type formed over the first III-nitride semiconductor region, and between the first terminal and the second terminal;
forming a first gate region being formed over the first highly doped semiconductor region, and between the first terminal and the second terminal;
forming a second III-nitride semiconductor region over the substrate, wherein the second III-nitride semiconductor region comprises a second heterojunction comprising at least a second two-dimensional carrier gas of the second conductivity type;
forming a third terminal operatively connected to the second III-nitride semiconductor region;
forming a fourth terminal operatively connected to the second III-nitride semiconductor region, wherein within an active area of the second heterojunction transistor the fourth terminal is laterally spaced from the third terminal in a first dimension;

forming a second plurality of highly doped semiconductor regions of the first conductivity type over the second III-nitride semiconductor region, the second plurality of highly doped semiconductor regions being formed between the third terminal and the fourth terminal, wherein the second plurality of highly doped semiconductor regions comprises at least two highly doped semiconductor regions of the first conductivity type in contact with the second III-nitride semiconductor region and laterally spaced from each other in a second dimension that is perpendicular to the first dimension; and forming a second gate region operatively connected to the second plurality of highly doped semiconductor regions, and wherein one of the first heterojunction transistor and the second heterojunction transistors is an enhancement mode field effect transistor and the other one of the first heterojunction transistor and the second heterojunction transistors is a depletion mode field effect transistor.

15. A circuit comprising:

one or more III-nitride semiconductor based heterojunction power devices, wherein each of the one or more III-nitride semiconductor based heterojunction power device comprises:

a first heterojunction transistor formed on a substrate, the first heterojunction transistor comprising:

a first III-nitride semiconductor region formed over the substrate, wherein the first III-nitride semiconductor region comprises a first heterojunction comprising at least a first two dimensional carrier gas of a second conductivity type;

a first terminal operatively connected to the first III-nitride semiconductor region;

a second terminal laterally spaced from the first terminal and operatively connected to the first III-nitride semiconductor region;

a first highly doped semiconductor region of a first conductivity type formed over the first III-nitride semiconductor region, and between the first terminal and the second terminal;

a first gate region being formed over the first highly doped semiconductor region, and between the first terminal and the second terminal; and a second heterojunction transistor formed on the substrate, the second heterojunction transistor comprising:

a second III-nitride semiconductor region formed over the substrate, wherein the second III-nitride semiconductor region comprises a second heterojunction comprising at least a second two dimensional carrier gas of the second conductivity type;

a third terminal operatively connected to the second III-nitride semiconductor region;

a fourth terminal operatively connected to the second III-nitride semiconductor region, wherein within an active area of the second heterojunction transistor the fourth terminal is laterally spaced from the third terminal in a first dimension;

a second plurality of highly doped semiconductor regions of a first conductivity type formed over the second III-nitride semiconductor region, the second plurality of highly doped semiconductor regions being formed between the third terminal and the fourth terminal, wherein the second plurality of highly doped semiconductor regions comprises at least two highly doped semiconductor regions of the first conductivity type in contact with the second III-nitride semiconductor region and laterally spaced from each other in a second dimension that is perpendicular to the first dimension; and a second gate region operatively connected to the first plurality of highly doped semiconductor regions, and wherein one of the first heterojunction transistor and the second heterojunction transistor is an enhancement mode field effect transistor and the other one of the first heterojunction transistor and the second heterojunction transistor is a depletion mode field effect transistor.

16. The circuit according to claim 15, said circuit further comprising a capacitor electrically connected to the third terminal.

17. The circuit according to claim 15, wherein the one or more III-nitride semiconductor based heterojunction power devices comprise a plurality of III-nitride semiconductor based heterojunction power devices.

18. The circuit according to claim 15, wherein the one or more III-nitride semiconductor based heterojunction power devices comprise a first III-nitride semiconductor based heterojunction power device and a second semiconductor based heterojunction power device arranged in a half bridge configuration.

* * * * *